USO08689061B2

(12) United States Patent  
Breiling et al.

(10) Patent No.: US 8,689,061 B2  
(45) Date of Patent: Apr. 1, 2014

(54) INTERLEAVER DEVICE AND RECEIVER FOR A SIGNAL GENERATED BY THE INTERLEAVER DEVICE

(75) Inventors: Marco Breiling, Erlangen (DE); Ernst Eberlein, Grossenseebach (DE); Rainer Hildinger, Erlangen (DE); Holger Stadali, Erlangen (DE); Aharon Jesus Vargas Barroso, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 449 days.

(21) Appl. No.: 13/165,848

(22) Filed: Jun. 22, 2011

(65) Prior Publication Data

US 2011/0289391 A1 Nov. 24, 2011

Related U.S. Application Data

(63) Continuation of application No. PCT/EP2009/067538, filed on Dec. 18, 2009.

(30) Foreign Application Priority Data

Dec. 23, 2008 (DE) .......................... 10 2008 062 808

(51) Int. Cl.  
*G06F 11/00* (2006.01)  
*H03M 13/03* (2006.01)

(52) U.S. Cl.  
USPC .......................................... 714/701; 714/786

(58) Field of Classification Search  
USPC .................. 714/701–702, 746, 786; 375/341; 370/337  
See application file for complete search history.

(56) References Cited

U.S. PATENT DOCUMENTS

| 6,678,476 | B1 | 1/2004 | Hou | |
|---|---|---|---|---|
| 7,506,220 | B2 * | 3/2009 | Wellig et al. | 714/701 |
| 2003/0126539 | A1 * | 7/2003 | Bysted et al. | 714/758 |
| 2003/0229829 | A1 * | 12/2003 | Maruwaka | 714/712 |
| 2010/0235706 | A1 | 9/2010 | Eberlein et al. | |

FOREIGN PATENT DOCUMENTS

| EP | 1 045 522 A1 | 10/2000 |
|---|---|---|
| EP | 1 928 116 A2 | 6/2008 |

OTHER PUBLICATIONS

Official Communication issued in corresponding International Application PCT/EP2009/067538, mailed on Apr. 15, 2010.  
Cain et al., "A Recommended Error Control Architecture for ATM Networks with Wireless Links", IEEE Journal on Selected Areas in Communications, IEEE Service Center, Piscataway, US, vol. 15, No. 1, Jan. 1, 1997, 13 pages.

(Continued)

*Primary Examiner* — Shelly A Chase  
(74) *Attorney, Agent, or Firm* — Keating & Bennett, LLP

(57) ABSTRACT

The inventive concept enables backward-compatible extension of existing interleaver-based transmission systems to the effect that in addition to an existing logical transport channel, which is interleaved using a standardized interleaver profile, further logical transport channels may be transmitted via the same physical transmission channel. In this context, the first transport channel obviously is reduced in terms of data rate, so that the additional transport channels may actually obtain a transmission capacity that is needed accordingly. Interleaver profiles of the further logical transport channels are derived, to this end, from the interleaver profile of the first transport channel.

29 Claims, 20 Drawing Sheets

(56) References Cited

OTHER PUBLICATIONS

Digital Video Broadcasting (DVB); Framing Structure, channel coding and modulation for Satellite Services to Handheld devices (SH) below 3 GHz; ETSI EN 302 583, ETSI Standards, LIS, Sophia Antipolis Cedex, France, vol. BC, No. V1.1.1, Mar. 1, 2008, p. 1-68.

Digital Video Broadcasting (DVB); DVB-SH Implementation Guidelines TM-SSP252r9f, ETSI v, European Broadcasting Union—Union Européenne de Radio-Télévision, Jan. 2008, pp. 1-320.

* cited by examiner

INTERLEAVER DEVICE AND RECEIVER FOR A SIGNAL GENERATED BY THE INTERLEAVER DEVICE

CROSS-REFERENCE TO RELATED APPLICATIONS

This application is a continuation of copending International Application No. PCT/EP2009/067538, filed Dec. 18, 2009, which is incorporated herein by reference in its entirety, and additionally claims priority from German Application No. DE 10 2008 062 808.5-31, filed Dec. 23, 2008, which is incorporated herein by reference in its entirety.

BACKGROUND OF THE INVENTION

The present invention relates to digital transmission technology and, in particular, to transmission concepts particularly well suited for time-varying transmission channels as may be encountered in mobile radio and broadcasting, and wherein several data types (e.g. audio, video) are to be transmitted via a single signal.

Time and/or frequency interleaving, combined with so-called forward error correction methods (FEC methods), is part of a basic principle in transmission technology. Such interleaving is also employed in digital video broadcasting (DVB), for example. A relatively new transmission standard among the DVB family with which digital broadcasting programs may be received via small and/or mobile devices is digital video broadcasting via satellite for handheld devices, DVB-SH for short (Digital Video Broadcasting—Satellite services to Handheld devices).

DVB-SH uses a 3GPP2 turbo encoder (3GPP2=$3^{rd}$ Generation Partnership Project 2) as the channel encoder. This turbo encoder has an information word of the size $L_{tc\text{-}input}$ supplied to it (for DVB-SH: $L_{tc\text{-}input}$=12,282 bits). After encoding the information words, the turbo encoder outputs code words at a predefined code rate CR. Even though for DVB-SH, fundamentally there are different code rates of from 1/5 to 2/3, it is currently possible for DVB-SH to set only one single code rate for all of the information words for one signal. Thus, all of the code words output by the encoder are equally sized, having a size of $L_{tc\text{-}output}$=($L_{tc\text{-}input}$+6)/CR.

Subsequently, the code words are subjected to bit-wise interleaving and subdivided into so-called interleaver units (IUs). For DVB-SH, the size of the individual interleaver units amounts to 126 bits in each case, which result from puncturing 2 bits among 128 bits, respectively, of the bit-interleaved code word. The interleaver units (IUs) of a code word are sorted into groups of 48 IUs. This is schematically depicted in FIG. 1.

A code rate CR=2/3 and an info word length $L_{tc\text{-}input}$=12,282 bits result in a code word length $L_{tc\text{-}output}$=18,144 bits, which corresponds to 144 interleaver units per code word. The interleaver units of a code word are sorted into groups of 48 IUs, which in the example presented here results in 144/48=3 groups. As is shown in FIG. 1, the IUs of the individual groups are arranged in a column-wise manner, so that a 48×3 IU matrix results. In FIG. 1, the individual IUs are labeled C, R, C meaning the column and R meaning the row of the IUs in the respective code word. For DVB-SH, the allowed code rates and IU sizes have been selected such that the code words fill up entire columns (FIG. 1: code rate 2/3 corresponds to three columns). Consecutive code words are sorted in consecutive columns, as has just been described.

Subsequently, the columns of the IU matrix are fed into an interleaver means 10, in particular into a convolutional interleaver means, one by one, which means comprises, in accordance with the 48 interleaver units, N=48 delay means, which will also be depicted as delay lines below for the purpose of clarity. For example, the delay means might be realized by means of an addressable (RAM) memory. I.e., the $0^{th}$ IU of a column ends up in the $0^{th}$ delay means or delay line (D=0), the $1^{st}$ IU of a column ends up in the $1^{st}$ delay line (D=1), etc., i.e. D=0, . . . , N−1. A delay means or delay line, e.g. in the form of a so-called tapped delay line, is some kind of shift register, wherein each register stage may store an entire IU, i.e., e.g., 126 bits, at once, which is then forwarded to the next stage as a block during shifting. Between each shifting operation, a new column of a code word is started at the input of the interleaver means 10, and accordingly, N=48 interleaved IUs are read at the output of the N=48 delay lines, i.e. at the output of the interleaver means 10. Such a write and/or read operation is referred to as an interleaver cycle. A delay of an interleaver unit, or IU, via a delay line is therefore an integer multiple of an interleaver cycle.

FIG. 2 shows the fundamental structure of a convolutional interleaver means 10, or a convolutional interleaver, as is employed, in a slightly modified form, for DVB-SH. Only the principle is to be explained below. For specific implementation details, please refer to the corresponding DVB-SH standardization documents.

The convolutional interleaver 10 comprises N=48 parallel delay lines 12. The lines 12 are fed, one by one, by an input coupler in the form of a demultiplexer 11 (DEMUX). It shall be mentioned at this point that the input coupler 11 and further couplers described below are depicted as (de)multiplexers only for clarity's sake. However, the couplers might also be realized by memory controllers and/or address generators for addressing a RAM memory, for example. The input of the demultiplexer 11 is coupled to the previously described bit interleaver (not shown). The demultiplexer 11 feeds every delay line 12 with exactly one interleaver unit (IU), which comprises, by way of example, 126 code bits, or symbols. Then the demultiplexer 11 switches to the next line 12, etc. At the beginning of a new column, the demultiplexer switches to the first line 12a. The end of a column is reached once the demultiplexer 11 has fed an IU into the last line (index N−1).

The convolutional interleaver 10 may be configured within a certain range of possibilities. Each delay line may comprise different and different numbers of delay elements (E=early part, M=middle part, L=late part), so that the delay may be different for each delay line 12.

Specifically, the convolutional interleaver 10 depicted in FIG. 2 comprises the input coupler 11, which is configured as a demultiplexer and is referred to as DEMUX in FIG. 2. In addition, there is an output coupler 12, which is configured as a multiplexer and is referred to as MUX in FIG. 2. A plurality of delay lines 12 are arranged between the two multiplexers 11 and 14, which delay lines are subdivided into three groups in the interleaver shown in FIG. 2. The first group is referred to as the early part 12d. The second group is referred to as the middle part 12e, and the third group is referred to as the late part 12f.

Each delay line, or interconnect line, except for the first interconnect line 12a, exhibits a specific delay, it being possible, however, for the delay lines to be configured differently within the three groups. In addition, FIG. 2 shows that the delay increases by one increment (E, M or L) from delay line (tap) to delay line in each case, so that, e.g., the interconnect line tap (middleStart-1) has a number of tap (middleStart-1) delay elements E. In addition, each delay line of the second group 12e has the same number of delay units E as the last delay line of the first group 12d and, additionally, a number of M delay elements that increases from delay line to delay line. Accordingly, each interconnect line of the late group 12f also has the same number of E delays as the last interconnect line of the first group 12d, and the same number of M delays as the last delay line of the second group 12e, as well as a number of L delay elements that increases from delay line to delay line. Please see patent document DE 10 2006 026 895 B3 for further details. The individual delays of the three groups 12d, 12e, 12f in combination represent an interleaver specification, or interleaver configuration.

The time passing between input and output may be different for each delay line of the convolutional interleaver means 10. This is why the N=48 IUs read out within one interleaver cycle do not belong to one single code word, but are a mixture of IUs of different code words (and are therefore interleaved). For the current DVB-SH standard, there are basically many different interleaver configurations, but currently only one single interleaver configuration, or interleaver specification, may be used for all of the info/code words within a signal.

With reference to FIG. 1, the N=48 IUs read out from the interleaver means 10 are now transmitted in a time-sequential manner. The next N=48 IUs that are read out are attached in accordance with their delays D(0 . . . 47). In the example of FIG. 1, a next transmission transmission frame (frame) starts after 21 interleaver cycles, i.e. D=21. In total, the 144 IUs of the code word represented are transmitted within transmission frames i to i+45, i.e. within 45 transmission frames. Consequently, an overall time delay of the exemplary interleaver means 10 amounts to 45 transmission frames.

FIG. 3 shows, by way of example, how several code words CW0, CW1, CW2 and CW3, all of which have been encoded at a code rate of 2/3, are interleaved together by the interleaver means 10 and are then transmitted in a temporal manner. As may be seen, the code words CW0, CW1, CW2 and CW3 are interleaved with one another by the interleaver 10, i.e. the original sequence of interleaver units of the individual code words has been changed by the interleaver 10.

Different data need different boundary conditions for transmission. Some data, such as radio and video programs, for example, which are received by a very large number of users at the same time, has to be robust against short-term (within the range of seconds) interferences of the transmission channel. However, signal delays only play a minor role. Such data should be protected for several seconds by means of a strong channel code (low code rate) and temporal interleaving.

Other data, as come up with telephone connections, for example, need to be less robust since they are received by one single user only, but real time plays a very important part in this context. Thus, only a limited delay (e.g. smaller than 150 milliseconds) may be introduced by the interleaving. Thus, such data should be provided with a channel code of a high code rate and relatively short interleaving.

For further data, there may possibly be almost-real-time requirements (a delay of less than 1 second) and a high level of robustness (e.g. signaling information for congestion or power control of an uplink (i.e. return links) of the terminals, or for a live transmission of a soccer match). Therefore, low code rates and a medium interleaving duration should be employed for this purpose.

Some data services (e.g. software update of a navigation device) tolerate a very long delay and need to be provided with only little robust protection (an error protection code on a higher transmission layer will see to this). Accordingly, high code rates and long interleaver durations are needed for this purpose.

A multitude of other scenarios with corresponding requirements are also feasible. Such requirements are referred to as the Quality of Service (QoS) of a transport channel. Potential QoS parameters of a service include, for example:
robustness,
latency allowed,
temporal jitter,
data rate.

Currently, DVB-SH provides only one single transport channel with one single QoS for all of the transmitted data within a physical signal, since only one single channel code and one single interleaver configuration are possible per signal.

However, it would be advantageous to have the possibility of simultaneously transmitting several transport channels having different QoS, i.e. different code rates and/or different interleaver configurations. Thus, telephone calls, for example, might also be transmitted in addition to the broadcast data originally envisaged for transmission.

Transmission of several transport channels, or so-called pipes, also takes place, for example, for ETSI SDR (European Telecommunications Standards Institute, Satellite Digital Radio), wherein entire time slots may be assigned to a first or a second transport channel in each case.

For the ETSI SDR standard, there are already several interleaver devices, or interleavers, for one single pipe (see FIG. 3 of ETSI TS 102 550 v1.3.1.) because a pipe is subdivided into time slots (however, the principle would also work, for other standards, without this subdivision into time slots). On the right-hand side in FIG. 3 of ETSI TS 102 550 v1.3.1., outputs of all of the time slot interleavers are then collected again by a so-called collector, and form a pipe. Chapter 4.9 describes that subsequently, all of the pipes are again (time-) multiplexed together. If a first pipe is to have a lower data rate, it will simply be made smaller in the time multiplex (with the SDR standard, it would be reduced by one or more time slots), and the available time (transmission resources) would be taken over by a second pipe.

The disadvantage of this approach is that it cannot be used for existing systems having a first transport channel that is read out from the output of an interleaver device within the transmitter and is then transmitted, and wherein transmission resources of the first transport channel are taken over by a second transport channel without the receiver having to be informed about this in order to de-interleave and decode the first transport channel.

There are already terminals for the current DVB-SH standard. Upgrades, or extensions, of this standard should therefore be in a backward-compatible form such that existing terminals may decode a portion of the data transmitted, specifically that portion of the data which is relevant to them. Since current terminals have been built for broadcast applications, they may represent corresponding broadcast data (e.g. audio and/or video programs). However, they currently cannot make any use of data from telephone connections, for example.

SUMMARY

According to an embodiment, a interleaver device for joint transmission of first and second transport channels via a transmission channel, the first transport channel having a sequence of first interleaver units, and the second transport channel having a sequence of second interleaver units, each interleaver unit having at least one symbol may have a convolutional interleaver for altering the sequence of the first interleaver units in accordance with a first convolutional interleaver specification, defining first transmission resources for joint transmission, so as to acquire an interleaved first transport channel having an altered sequence of first interleaver units, and for altering the sequence of the second interleaver units in accordance with a second convolutional interleaver specification defining second transmission resources for joint transmission, so as to acquire an interleaved second transport channel having an altered sequence of second interleaver units, wherein the second convolutional interleaver specification are derived from the first convolutional interleaver specification, so that the second transmission resources are different from the first transmission resources; and a combiner for combining the interleaved first transport channel and the interleaved second transport channel in accordance with the first or the second convolutional interleaver specification, so as to acquire a transmission stream for the transmission channel.

According to another embodiment, a transmitter for generating a transmit signal, may have an encoder which adds redundancy and has a first code rate smaller than 1 and a second code rate smaller than 1, said encoder being configured to generate, from a first information word, a first code word of a first transport channel at the first code rate, and configured to generate, from a second information word, a second code word of a second transport channel at the second code rate; an interleaver device for joint transmission of first and second transport channels via a transmission channel, the first transport channel having a sequence of first interleaver units, and the second transport channel having a sequence of second interleaver units, each interleaver unit having at least one symbol, wherein the interleaver device may have a convolutional interleaver for altering the sequence of the first interleaver units in accordance with a first convolutional interleaver specification, defining first transmission resources for joint transmission, so as to acquire an interleaved first transport channel having an altered sequence of first interleaver units, and for altering the sequence of the second interleaver units in accordance with a second convolutional interleaver specification defining second transmission resources for joint transmission, so as to acquire an interleaved second transport channel having an altered sequence of second interleaver units, wherein the second convolutional interleaver specification are derived from the first convolutional interleaver specification, so that the second transmission resources are different from the first transmission resources; and a combiner for combining the interleaved first transport channel and the interleaved second transport channel in accordance with the first or the second convolutional interleaver specification, so as to acquire a transmission stream for the transmission channel, wherein the convolutional interleaver has the first code word supplied to it that is interleaved in accordance with the first convolutional interleaver specification, and wherein the convolutional interleaver has the second code word supplied to it that is interleaved in accordance with the second convolutional interleaver specification; and a modulator for modulating a data stream, output by the interleaver device, of interleaved first and second code words onto a transmission channel.

According to another embodiment, a receiver for receiving a receive signal having first and second interleaved code words, the first interleaved code word having a sequence of first interleaver units interleaved in accordance with a first convolutional interleaver specification, which first interleaver units belong to a first transport channel, and the second interleaved code word having a sequence of second interleaver units interleaved in accordance with a second convolutional interleaver specification, which second interleaver units belong to a second transport channel, the second convolutional interleaver specification being derived from the first convolutional interleaver specification, and the interleaved first transport channel and the interleaved second transport channel being mutually interleaved, in accordance with the first or second convolutional interleaver specification, such that a receiver configured to receive the first transport channel and not configured to receive the second transport channel may correctly receive and decode the first transport channel despite the presence of the second transport channel, wherein the receiver may have a provider for providing de-interleaver information with which first and second de-interleaver specifications may be determined; and a de-interleaver for altering the sequence of the second interleaver units in the multiplex signal in accordance with the second de-interleaver specification, which is derived from the first convolutional interleaver specification and is inverse to the second convolutional interleaver specification, so as to acquire a de-interleaved second code word, such that the second transport channel may be correctly received and decoded.

According to another embodiment, a method for joint transmission of first and second transport channels via a transmission channel, the first transport channel having a sequence of first interleaver units, and the second transport channel having a sequence of second interleaver units, each interleaver unit having at least one symbol may have the steps of altering the sequence of the first interleaver units in accordance with a first convolutional interleaver specification, defining first transmission resources for joint transmission, so as to acquire an interleaved first transport channel having an altered sequence of first interleaver units; deriving a second convolutional interleaver specification from the first convolutional interleaver specification; and altering the sequence of the second interleaver units in accordance with the second convolutional interleaver specification defining second transmission resources for joint transmission, so as to acquire an interleaved second transport channel having an altered sequence of second interleaver units, wherein the second convolutional interleaver specification are derived from the first convolutional interleaver specification, so that the second transmission resources are different from the first transmission resources; and combining the interleaved first transport channel and the interleaved second transport channel in accordance with the first or the second convolutional interleaver specification, so as to acquire a transmission stream for the transmission channel.

According to another embodiment, a method of receiving a receive signal having first and second interleaved code words, the first interleaved code word having a sequence of first interleaver units interleaved in accordance with a first convolutional interleaver specification, which first interleaver units belong to a first transport channel, and the second interleaved code word having a sequence of second interleaver units interleaved in accordance with a second convolutional interleaver specification, which second interleaver units belong to a second transport channel, the second convolutional interleaver specification being derived from the first convolutional interleaver specification, and the interleaved first transport channel and the interleaved second transport channel being mutually interleaved, in accordance with the first or second convolutional interleaver specification, such that a receiver configured to receive the first transport channel and not configured to receive the second transport channel may correctly receive and decode the first transport channel despite the presence of the second transport channel may have the steps of providing de-interleaver information with which first and second de-interleaver specifications may be determined; and altering the sequence of the second interleaver units in the multiplex signal in accordance with the second de-interleaver specification, which is derived from the first convolutional interleaver specification and is inverse to the second convolutional interleaver specification, so as to acquire a de-interleaved second code word, such that the second transport channel may be correctly received and decoded.

According to another embodiment, a computer program may have a program code for performing one of the above-mentioned methods, when the computer program runs on a computer.

The finding of the present invention is that backward compatibility is achieved in that an existing first transport channel interleaved by means of a first interleaver specification has a second interleaved transport channel added to it which is interleaved by means of a second interleaver specification derived from the first interleaver specification, such that transmission resources defined by the first and second interleaver specifications are matched to each other such that joint transmission of the first and second interleaved transport channels via a joint transmission channel does not lead to any conflicts or collisions at all. For this purpose, an original data rate of the first transport channel is naturally reduced so as to free transmission resources for the second transport channel. By the second interleaver specification, which is cleverly derived, the transmission resources that have been freed up are now assigned to the second transport channel in a collision-free manner.

In particular, the interleaved first transport channel and the interleaved second transport channel are combined, e.g. by a combiner, in accordance with the first or the second convolutional interleaver specification so as to obtain a transmission stream for the transmission channel. In this manner, backward compatibility is ensured because the first transport channel is not changed by the second transport channel. The combiner "sorts" the second transport channel into "gaps", as it were, which exist on account of the fact that the first transmission resources do not take up the entire resources of the transmission channel. Nevertheless, a receiver configured only for the first convolutional interleaver specification is still capable of extracting said second transport channel. Data which exist in places where the second transport channel is located are indeed received and processed by this simple receiver for the first transport channel, but are decoded as errors and consequently discarded. In addition, the sequence of code words from the first and the second, or one or several further transport channels influences the combiner, since the code words of the different transport channels are interleaved differently, and the combiner therefore will "sort" interleaver units in accordance with the first or second convolutional interleaver specification.

In contrast to a non-compatible time multiplex of the first and second transport channels—wherein a transport channel would comprise a contiguous part of a transmission frame, e.g., in the event of two channels, half of a transmission frame or, in the event of three channels, a third—the interleaver units are mixed with each other in the transmission stream in embodiments of the invention, so that a sequence of interleaver units, which comes about on account of the first interleaver specification, from one and the same transport channel will be smaller than half of a transmission frame in the event of two transport channels, a third of a transmission frame in the event of three transport channels, etc. Depending on the interleaver specification, it is advantageous for the number of consecutive interleaver units of the same transport channel to be smaller than 20.

The transmission stream is further configured such that second interleaver units of the interleaved second transport channel TC2, each of which goes back to a code word of the second transport channel, are arranged, within the transmission stream, at the second transmission resources, which are defined in accordance with the second convolutional interleaver specification and are different from the first transmission resources.

An existing receiver designed for the first transport channel will be able to decode and process same in an error-free manner since the interleaved first transport channel and the interleaved second transport channel are mutually interleaved in accordance with the first or second convolutional interleaver specification. Said receiver will not be able to correctly decode interleaver units of the second transport channel, and it will therefore output an error, such that the second transport channel will be recognized as an error and be discarded by the existing receiver. In this manner, backward compatibility is ensured.

An inventive receiver, by contrast, obtains information about the additional second transport channel and will find the interleaver units of the second transport channel correctly within the transmission stream, and will de-interleave same by means of the inverse second convolutional interleaver specification, so that the receiver may correctly decode the second transport channel.

BRIEF DESCRIPTION OF THE DRAWINGS

Embodiments of the present invention will be explained below in more detail with reference to the accompanying figures, wherein.

DETAILED DESCRIPTION OF THE INVENTION

Figure 1:
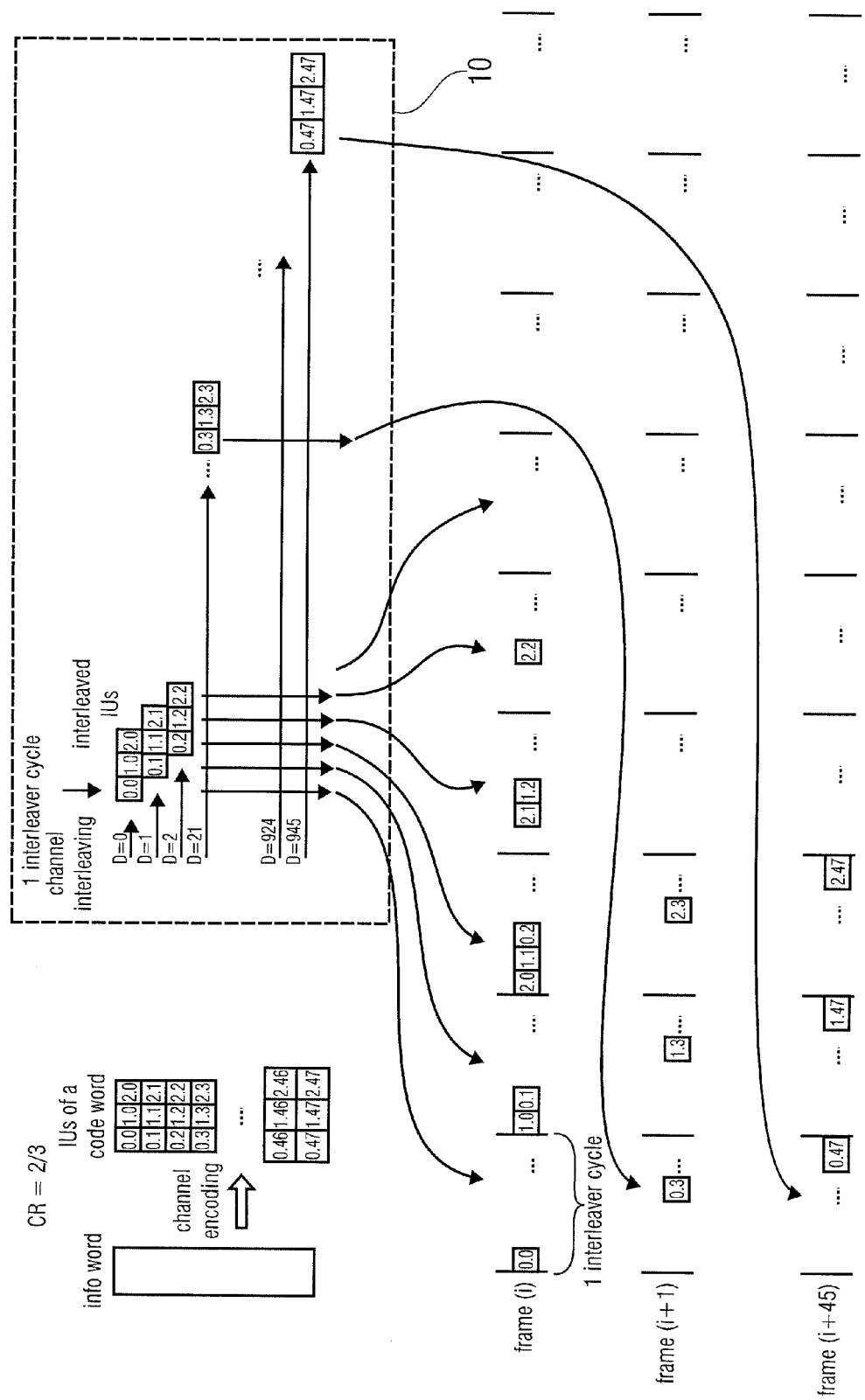
FIG. 1 shows a schematic representation of interleaving a code word for DVB-SH.

In addition, embodiments of the present invention comprise an interleaver device for joint transmission of first and second transport channels via a transmission channel, the first transport channel comprising a sequence of first interleaver units, and the second transport channel comprising a sequence of second interleaver units, each interleaver unit comprising at least one symbol. The interleaver device comprises a first interleaver means for altering the sequence of the first interleaver units in accordance with a first interleaver specification, defining first transmission resources for joint transmission, so as to obtain an interleaved first transport channel comprising an altered sequence of first interleaver units. In addition, the interleaver device comprises a second interleaver means for altering the sequence of the second interleaver units in accordance with a second interleaver specification defining second transmission resources for joint transmission, so as to obtain an interleaved second transport channel comprising an altered sequence of second interleaver units. The second interleaver specification are derived from, or dependent on, the first interleaver specification, so that the second transmission resources are different from the first transmission resources. By means of a combiner, the interleaved first transport channel and the interleaved second transport channel are combined, so as to obtain a transmission stream for the joint transmission channel, the first and second interleaver units of the interleaved first and second transport channels, each of which goes back to a code word of the first and second transport channels, respectively, being arranged, within the transmission stream, at the first and second transmission resources such that they are mutually interleaved. I.e. the first interleaver units, which go back to a code word of the first transport channel, are arranged at the first transmission resources, the second interleaver units, which go back to a code word of the second transport channel, are arranged at the second transmission resources.

In other words, the interleaver means is configured to alter the sequence of the first interleaver units in accordance with a first interleaver specification. In this context, a data rate of the first transport channel, and the first interleaver specification define first transmission resources for joint transmission. Due to the interleaving, an interleaved first transport channel is obtained which comprises an altered sequence of first interleaver units. The data rate of the first transport channel is set such that, as compared to a higher data rate of the first transport channel, first transmission resources are freed up for second interleaver units of the second transport channel for joint transmission. The interleaver means is further configured to alter the sequence of the second interleaver units in accordance with a second interleaver specification which defines second transmission resources for joint transmission, so as to obtain an interleaved second transport channel comprising an altered sequence of second interleaver units. The second interleaver specification is derived from the first interleaver specification such that the second transmission resources correspond to at least part of the first transmission resources that have become freed up.

The interleaver specifications may be delay specifications, or delay interleaver profiles (time interleaving) and/or frequency interleaver profiles (frequency interleaving), for example. Accordingly, the transmission resources may be time slots and/or frequency carriers.

Figure 2:
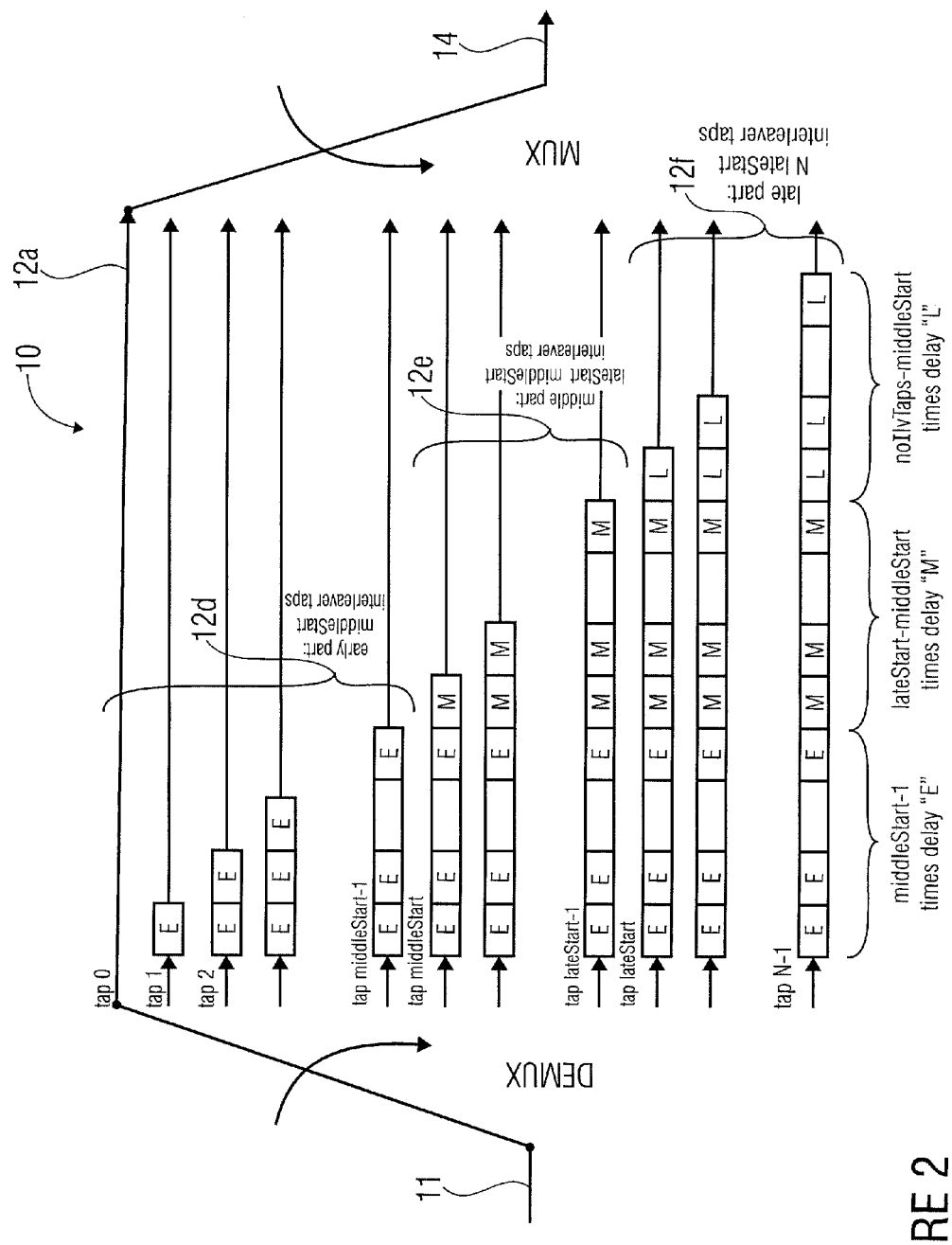
FIG. 2 shows a schematic representation of a convolutional interleaver employed for DVB-SH.
Figure 3A:
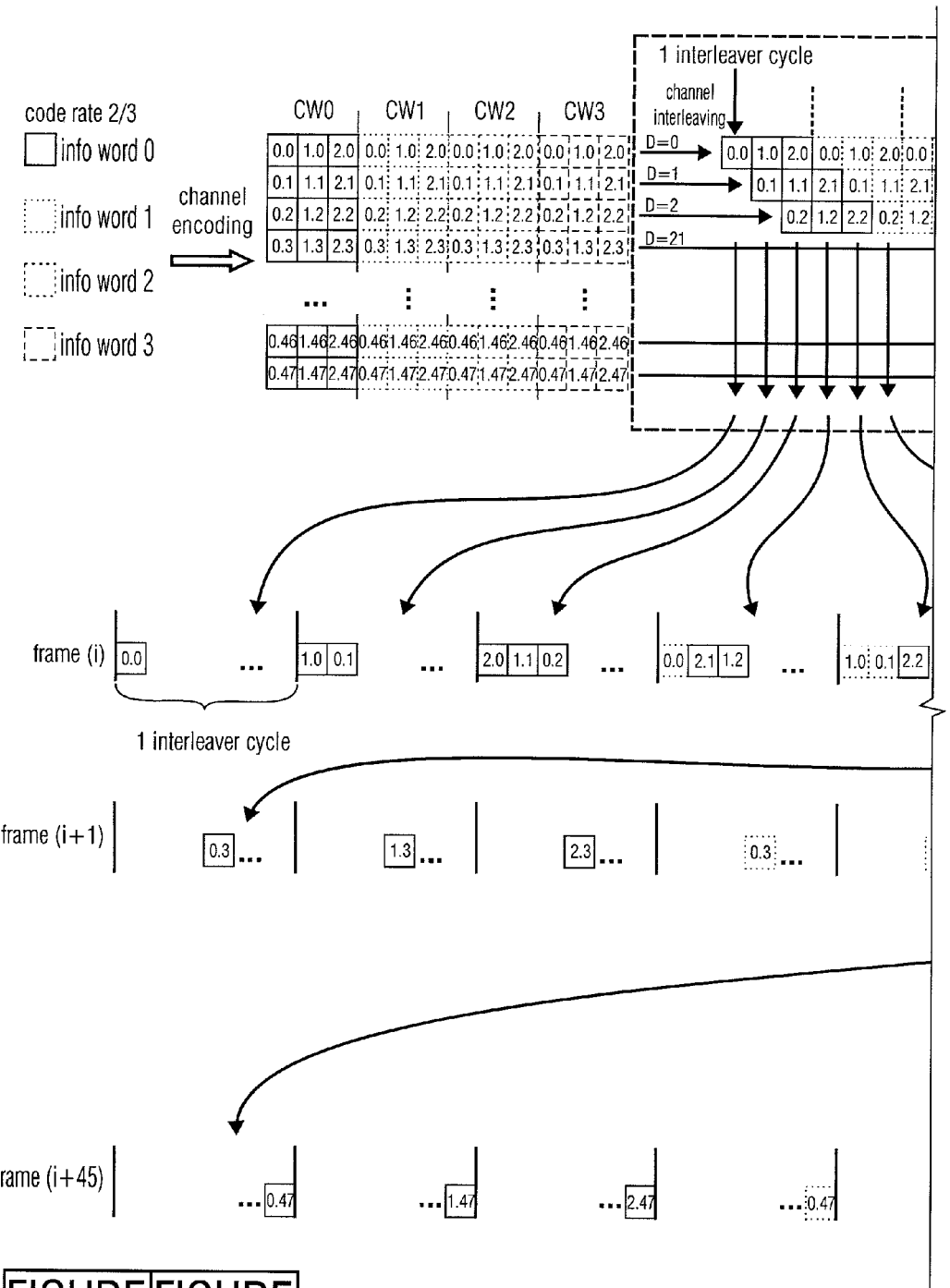
FIG. 3 shows a schematic representation of interleaving several code words for DVB-SH.
Figure 3B:
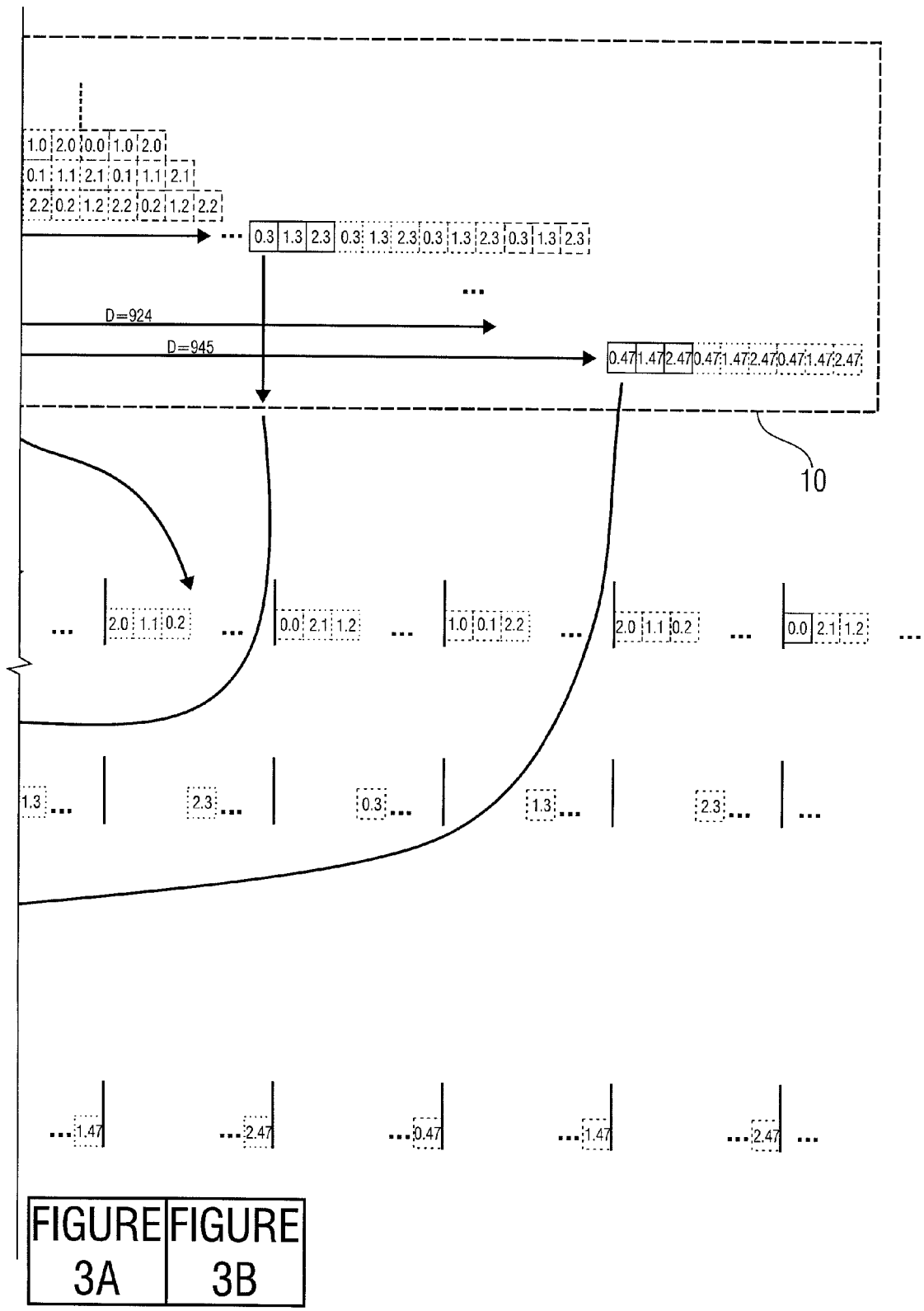

In accordance with an embodiment, the interleaver means comprises at least one convolutional interleaver means, or convolutional interleaver, as was described above by way of example with reference to FIG. 2. In this context, it is basically irrelevant whether each of the first/second interleaver units comprises several symbols, such as, e.g., 126 bits for DVB-SH, or only one symbol or bit.

In accordance with an embodiment, the first and second interleaver specifications are convolutional interleaver specifications, and in particular a first and a second delay specification, i.e. a first and a second delay interleaver profile. In this context, the first convolutional interleaver specification is predefined, such as for current DVB-SH systems, for example. To guarantee backward compatibility, the predefined first convolutional interleaver specification is not changed at all. In order to be able to also transmit a second transport channel in the form of second code words in a joint transmission channel, only a data rate of the first transport channel is reduced, so that transmission resources, such as time slots (or frequency carriers), for example, become freed up for the second transport channel.

The second convolutional interleaver specification for the second transport channel is cleverly derived, in embodiments, from the first convolutional interleaver specification of the first transport channel, so that second interleaved code words, or interleaver units, of the second transport channel can be accommodated in the transmission resources that have become freed up, and can be transmitted along with the first transport channel via the joint transmission channel. The second interleaver specification may be derived such that it does justice to a desired low-level or high-level interleaving operation, low-level interleaving meaning interleaving of the interleaver units over only a short time period, whereas high-level interleaving comprises "blurring" the interleaver units over a relatively long time period. The same also applies to frequency interleaving.

In accordance with an embodiment of the present invention, the largest delay defined by the second interleaver specification is smaller than a largest delay defined by the first interleaver specification, so that the second transport channel may be transmitted at a lower latency than the first transport channel. This is useful when the second transport channel is comprised of latency-sensitive data, such as telephony data, for example.

In embodiments, the first and second interleaver means each comprise N delay lines, it also being feasible for a number $N_2$ of delay means or delay lines of the second interleaver means to be an integer multiple of a number $N_1$ of delay means or delay lines of the first interleaver means, i.e. $N_2 = N_1 * x$ (x being an integer). The second interleaver specification may be derived from the first interleaver specification such that an $n^{th}$ delay $D_2(n)$ associated with the $n^{th}$ (e.g. n= 0 ... $N_2$−1) delay line of the second interleaver means is derived from a delay associated with an (n mod $N_1$)$^{th}$ delay line of the first interleaver means. Nevertheless, it shall be assumed for clarity's sake that $N_2=N_1=N$. The $n^{th}$ delay $D_2(n)$ of the second interleaver specification may be derived from the $n^{th}$ delay $D_1(n)$ of the first interleaver specification in accordance with $D_2(n)=D_1(n) \bmod [M(n)*L]$, mod signifying the mathematical symbol for the modulo operation, L signifying a period duration to be explained below, and M(n) signifying a natural number. The period L may be indicated in interleaver cycles, which shall be explained below. The period length is specified essentially by parameters such as the data rates of the first and second transport channels. If, for example, the gross data rate (following channel encoding) of the first transport channel amounts to $x_1/X$ of the overall data rate X (i.e. during $x_1$ of X interleaver cycles, columns of the first transport channel are shifted into the first interleaver means), and if the data rate of the second transport channel amounts to $x_2/X$ of the overall data rate X, wherein $x_1+x_2 \leq X$, a period duration L=X interleaver cycles may result. For example, $x_1$ interleaver cycles of the first transport channel are initially interleaved within each period of the length $X=x_1+x_2$, followed by $x_2$ interleaver cycles of the second transport channel.

In accordance with a further embodiment, the $n^{th}$ delay $D_2(n)$ (e.g. n=0 ... N−1) of the second interleaver specification is derived from the $n^{th}$ delay $D_1(n)$ of the first interleaver specification in accordance with $D_2(n)=D_1(n)\pm[M(n)*L]$.

As has already been mentioned, the second interleaver means may comprise an integer multiple of $N_1$ delay lines, and the delay $D_2(m)$ (m=0 ... (x*$N_1$−1)) is derived from $D_1(n)$ with n=m mod N in accordance with the above-mentioned calculation specifications.

Other embodiments of the present invention provide a receiver for receiving a multiplex signal comprising a first and a second interleaved code word, the first interleaved code word comprising a sequence of first interleaver units interleaved in accordance with a first interleaver specification, and the second interleaved code word comprising a sequence of second interleaver units interleaved in accordance with a second interleaver specification, the second interleaver specification being derived from the first interleaver specification, the interleaved second interleaver units being arranged, within the multiplex signal, at second transmission resources which are defined in accordance with the second convolutional interleaver specification and are different from the first transmission resources, and each interleaver unit comprising at least one symbol. The receiver has a means for providing de-interleaving information with which a first and a second de-interleaving specification may be determined so as to control a convolutional de-interleaving means for altering the sequence of the second interleaver units within the multiplex signal in accordance with the second de-interleaver specification that is derived from the first convolutional interleaver specification and is inverse to the second convolutional interleaver specification, so as to obtain a de-interleaved second code word.

The interleaver units of the interleaved first and second code words may be extracted from the multiplex signal, and the sequence of the second interleaver units may be altered in accordance with the second de-interleaver specification, which is derived from the first interleaver specification and is inverse to the second interleaver specification, so as to obtain a de-interleaved second code word.

By means of the inventive concept, existing interleaver-based transmission systems may be expanded to the effect that in addition to an existing logical transport channel, which is interleaved using a standardized interleaver profile, further logical transport channels may be transmitted via the same physical transmission channel. In this context, the first transport channel is obviously reduced in terms of data rate, so that the additional transport channels may actually obtain a transmission capacity that is needed accordingly. If the data rate that remains within the first transport channel may be decoded by "legacy receivers", the concept described here represents an elegant method of extending existing transmission systems, such as DVB-SH, for example, while at the same time being able to ensure backward compatibility.

This means, a system is provided which comprises a first transport channel that is read out from the output of an interleaver device within the transmitter and is then transmitted, and wherein transmission resources of the first transport channel are taken over by a second transport channel without the receiver having to be informed about this in order to de-interleave and decode the first transport channel (i.e. without this influencing the position of the transmission resources belonging to the remaining code words of the first transport channel).

The present invention enables introducing at least one further transport channel into an existing transmission system comprising an interleaved transport channel, said additional transport channel possibly doing justice to a different QoS without having to alter the interleaver specification of the first transport channel. In this context, consideration will be given below to a scenario wherein there is a first interleaved transport channel for robust transmission of broadcasting information, such as for DVB-SH, for example. A further, non-interleaved or only slightly interleaved second transport channel is to be introduced into this system for transmitting real-time data, for example. By way of example, both transport channels are transmitted in a time-division multiplex process. That is, time intervals or time slots represent transmission resources. The multiplexing arrangement, i.e. the question of which transport channel is transmitted in which time slots, should be the same for each transmission frame. This resource occupation information may be transmitted as side information together with the transmit signal.

A further requirement to be made is backward compatibility, such that the interleaved code words of the first transport channel may be correctly decoded by conventional receivers. In the exemplary case of DVB-SH, this means that, despite the existence of a second transport channel, conventional receivers designed for receiving the first transport channel should continue to be able to receive and decode same. Such a conventional receiver would obviously also try to decode the remainder of a transmission frame, i.e. also the additional second transport channel. However, since said receiver uses the decoding parameters of the first transport channel, the second transport channel generally cannot be correctly decoded. To this end, there is a mechanism, described in "DVB-SH Implementation Guidelines", DVB Document A120, May 2008, Para. 7.2.2.5., which indicates how any code words that have not been correctly decoded are to be handled. By means of this process, packets of the second transport channel would be discarded or marked as erroneous, so that the data link layer (layer 2) can ignore them. Since services that are made available with the second transport channel may be regarded as extended services, defective decoding of such an extended service on the part of conventional receivers would be tolerable.

Since the current definition of the DVB-SH signaling field comprises numerous RFU bits (RFU=reserved for future use), it is unproblematic to accommodate therein additional bits for configuration parameters (e.g. code rate, interleaver specification) of the second transport channel. In addition, resource occupation information for the transport channel multiplex may be transmitted within the signaling field, so that a corresponding receiver will know which part of an SH transmission frame belongs to which transport channel.

For the following considerations, the following should be taken into account. For a first, defined interleaver specification for the first transport channel, a conventional receiver will expect interleaver units of a first code word of the first transport channel at certain time intervals of an SH transmission frame on account of the interleaver cycle of the first interleaver after N interleaver units (IUs). These transmission resources belonging to the first transport channel is not to be occupied by the second transport channel.

Even though the present invention is described, by way of example, using DVB-SH and time-division multiplex methods, a person skilled in the art will immediately recognize that the present invention may also be applied to other multiplexing techniques, such as frequency-division multiplexing. In this case, individual frequency bands, or frequency carriers, would represent the transmission resources. Thus, the following explanations are only exemplary.

Before embodiments of the present invention will be explained in more detail with reference to FIGS. 6 to 15, the following considerations shall be made below with reference to FIGS. 4 and 5.

To this end, it shall initially be assumed that the second transport channel is a real-time transport channel that is not subjected to any interleaving.

Figure 4:
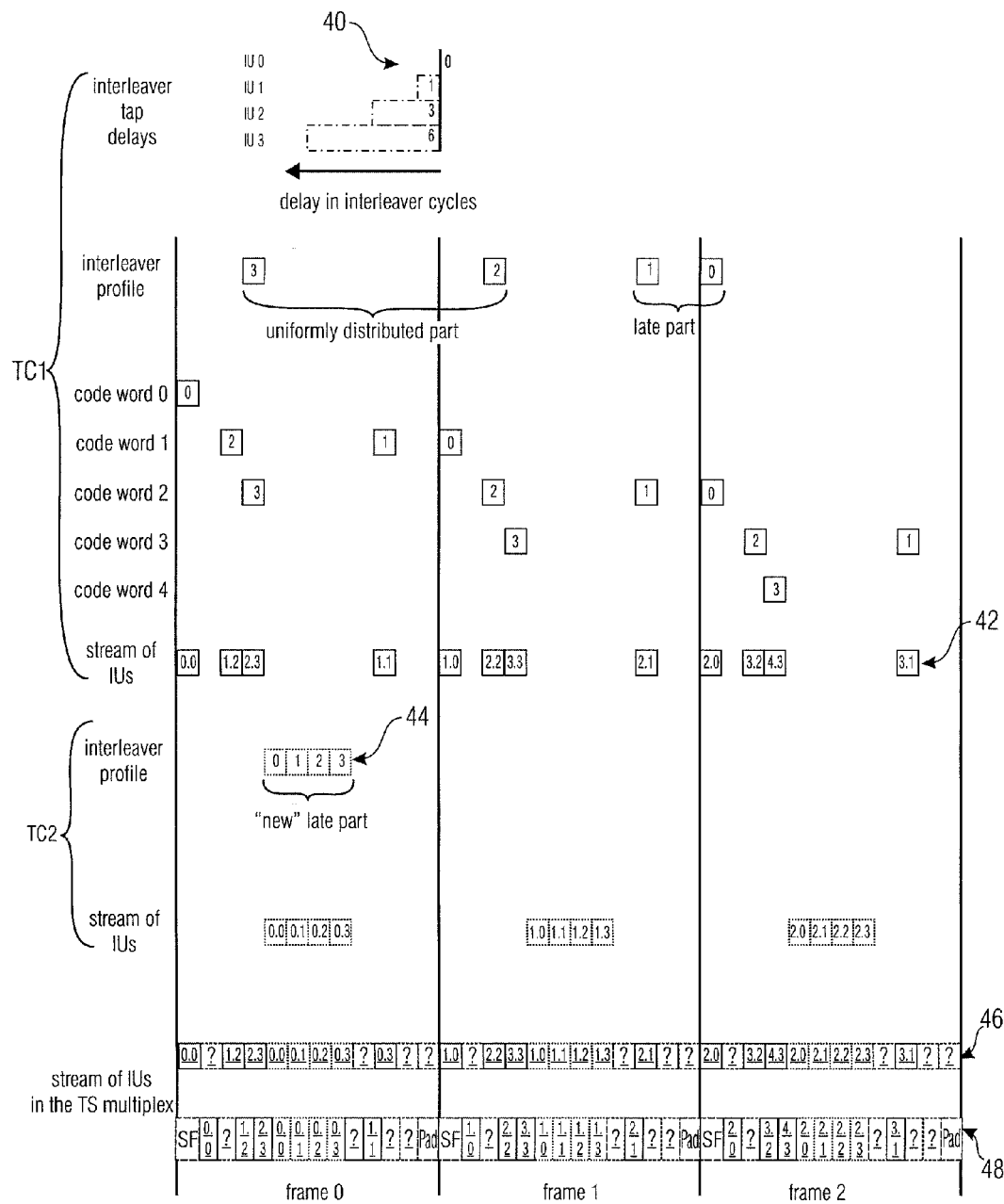
FIG. 4 shows a schematic representation of a disadvantageous joint transmission of first and second transport channels via a joint transmission channel.

FIG. 4 represents a potential situation. Without restricting the generality, we shall proceed on the assumption of a convolutional interleaver in accordance with the principle of FIG. 2, with N=4, i.e. four parallel delay lines. In addition, a code word CW has a length/size, by way of example, of precisely one interleaver cycle, i.e. four interleaver units (IUs). A transmission frame has a time duration which corresponds to twelve interleaver units, i.e. three code words or three interleaver cycles.

The upper part of FIG. 4 represents the conditions for the first transport channel TC1. The interleaver specification, or interleaver profile, 40 comprises, by way of example, a so-called uniformly distributed and late part. The interleaver profile 40 might also represent the length of the delay lines in the receiver (the previous examples represented interleaving within the transmitter), so that one might also speak of a de-interleaver profile. However, this is rather irrelevant to the considerations that follow.

For uniformly distributed interleaving, the IUs belonging to a block or code word are uniformly distributed over time, i.e. the distance between the IUs is essentially identical at the output of the interleaver. Such a configuration is useful when the transmission channel produces random short drop-outs (poor channel state) and then interferes with the individual IUs in a quasi-random manner. In particular, this configuration is useful with relatively high code rates. Some of the IUs are therefore transmitted in a uniform manner, and the remainder comes as a late part in a burst-like manner. In this case, the late part should comprise a sufficient number of IUs so that in good receiving conditions it will suffice for error-free decoding. Thus, this interleaver profile is suitable for so-called fast access, so that an access time (e.g. after switch-on or change of channels) may be kept low despite a long interleaver. The remaining IUs in the uniformly distributed part are intended to offer protection against random failures of IUs.

The subsequent lines CW0, CW1, CW2, CW3 and CW4 in FIG. 4 show how the uniformly distributed and late interleaver units of the respective code word (CW0, CW1, CW2, CW3, CW4) are distributed over three consecutive transmission frames: frame 0, frame 1 and frame 2. In this context, a throughput of one code word per transmission frame shall be assumed. If the five code words CW0, CW1, CW2, CW3 and CW4 are supplied, one by one, to a first interleaver unit in the form of a convolutional interleaver with the interleaver profile 40, one will obtain the first current 42, depicted in FIG. 4, of interleaved first code words having the indices x, y, wherein x stands for the code word index, and y for the IU index.

In addition, a possible option for a configuration of the second transport channel TC2 is shown. For the transport channel TC2, a throughput of one code word per transmission frame shall also be assumed. The interleaver profile 44 is selected such that all of the IUs of a code word of the TC2 are transmitted in a non-interleaved sequence, i.e. only a late part (in the DVB-SH configuration: common_multiplier=0) is used. However, this configuration would not be possible in the current DVB-SH standard, since the parameters allow only common_multiplier 1. Therefore, a new interleaver parameter setting would be needed.

The last two lines 46, 48 in FIG. 4 represent a time-division multiplex by means of combining TC1 and TC2, or their streams of IUs. One may recognize that for the configuration discussed with reference to FIG. 4, simultaneous transmission of interleaved and non-interleaved data is possible. However, the disadvantage of this approach is that the two transport channels TC1 and TC2 are not perfectly matched to each other. Several time slots envisaged for interleaver units remain unused and are marked by "?" in FIG. 4. Said unused transmission resources can be re-padded neither by the interleaver profile 40 of the first transport channel TC1 nor by the interleaver profile 44 of the second transport channel TC2.

One might possibly use the distributed, unused transmission resources or time slots "?" for TC2. However, this would have an impact on the latency of a code word and would need a rather complicated and unaesthetic transmission mechanism. If a transmission frame is provided with a signaling field SF and the needed padding units, or padding capacity units (padding CUs), a multiplex signal 48 will result which is depicted in the last line of FIG. 4.

Even though one may recognize, with reference to the example of FIG. 4, that a coexistence of two transport channels is possible for DVB-SH, this example is anything but efficient, and is neither easy to understand nor easy to implement.

Figure 5:
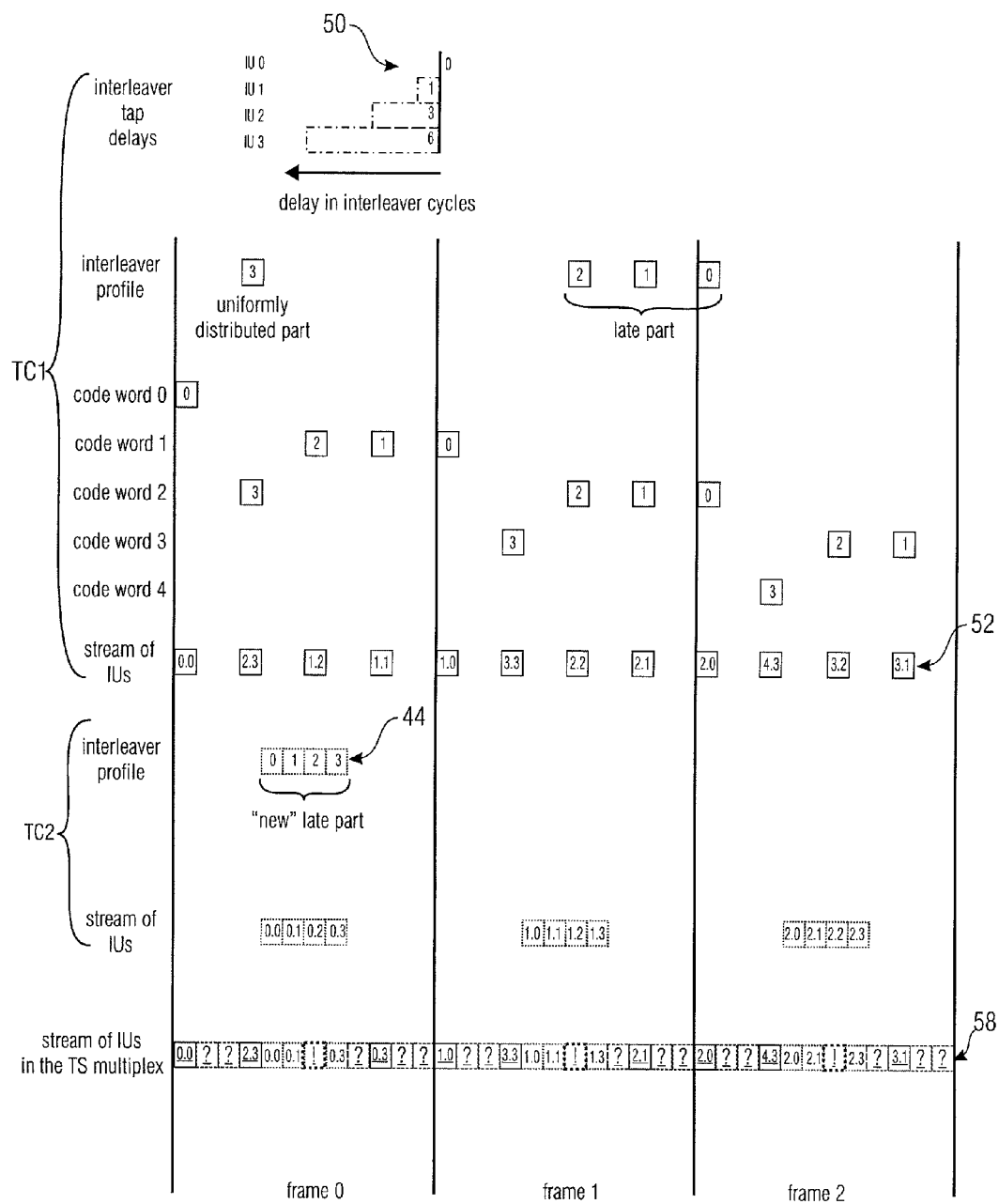
FIG. 5 shows a schematic representation of a transmission of two transport channels via a joint transmission channel, which transmissions collide in terms of time.

The next example, shown in FIG. 5, shows that the coexistence of the two transport channels that has just been described is no longer possible as soon as the configuration of the transport channel TC1 is altered even slightly.

With the interleaver specification 50 of the first transport channel TC1, as compared to the interleaver specification 40, only the delay of the second delay line (IU2) was reduced from three to two interleaver cycles. However, this minor alteration has a dramatic effect on the multiplex of the transport channels TC1 and TC2. As the IU stream 52 shows, there are now no four contiguous, consecutive time slots wherein the non-interleaved IUs of the transport channel TC2 may be accommodated. This means that the second code words of TC2 cannot remain, within a time transmission frame, at the same position as in the example of FIG. 4, since within the time slots marked with "!" of the multiplex signal 58, conflicts would arise between TC1 and TC2.

In the example of FIG. 5, coexistence of TC1 and TC2 is not readily possible.

If one takes into account the following additional aspects, which have been omitted above for simplicity's sake, one may assume that interrelations become even more complex, and that achieving coexistence between an interleaved TC1 and an uninterleaved TC2 becomes even more difficult:

TC1 and TC2 may have different code word lengths (i.e. different numbers of interleaver cycles).

If the delay of a delay line becomes larger than a number of code words fitting into a transmission frame (e.g., for DVB-SH: 27 for OFDM and code rate 1/5), the interleaver units of the first transport channel may form irregular patterns, which may result in that even fewer transmission resources may possibly be available for TC2.

A real-time transport channel should transmit several bursts, or time slots, per transmission frame so as to delimit latency. A DVB-SH transmission frame has a duration of about 120 ms if we assume, for a typical case of application, that OFDM modulation uses 16 QAM and a bandwidth of 5 MHz. If time slots, or associated IUs, of TC2 were transmitted only once per SH transmission frame, a delay of up to 120 ms would be caused by the transmission frame alone. Further delays (buffering, multiplexing, processing, etc.) would add to this, so that a target value of a delay of, e.g., 150 ms at a maximum would probably be exceeded. Transmission of two or more bursts per transmission frame aggravates the problems that have just been described, since, for the transmission, a sufficient number of free time intervals are to be found which are not occupied by the transmission of TC1.

Flexibility: It is desirable that the interleaver specification 40, 50 of the first transport channel TC1 does not have to be changed when a throughput share of the transport channel 2 is altered (e.g. more code words per frame for TC2, and fewer for TC1). However, as may be concluded from the above two examples, reducing the share of TC1 does not necessarily mean a proportional increase in the share of TC2. If the share of TC2 is 0% (i.e. TC1 has 100%), three code words may be transmitted per frame for TC1. If the share of TC2 in the first example (FIG. 4) is 33%, i.e. one code word per frame, the share of TC2 will also have to be reduced to 33%, rather than to 66%, for example. In the second example (FIG. 5), the share of TC1 would even need to be reduced to 0%. Firstly, this is very inefficient, and secondly, it is a highly non-linear function.

Diversity reception might pose even more problems. Conventional receivers would operate at diversity reception for the entire DVB-SH transmission frame, i.e. they would combine satellite receive signals and receive signals from terrestrial repeaters. When parts of the satellite receive signal incorporate TC2, where the terrestrial receive signal incorporates TC1, this might result in destructive combining It may be assumed that the aspects listed above
(a) would cause a loss of capacity, since parts of the DVB-SH transmission frame could not be used (the time slots provided with "?" in FIG. 4), and
(b) would lead to difficulties in finding suitable interleaver profiles, and/or
(c) would result in a complicated multiplexing mechanism, fraught with many special cases, for an SH transmission frame.

Thus, the approach described with reference to FIGS. 4 and 5 is hardly suited for performing a backward-compatible modification of the existing DVB-SH standard with the aim of a second real-time transport channel.

Embodiments of the present invention which can elegantly achieve this goal given the above-described requirements will be described below with reference to FIGS. 6 to 14.

Figure 6:
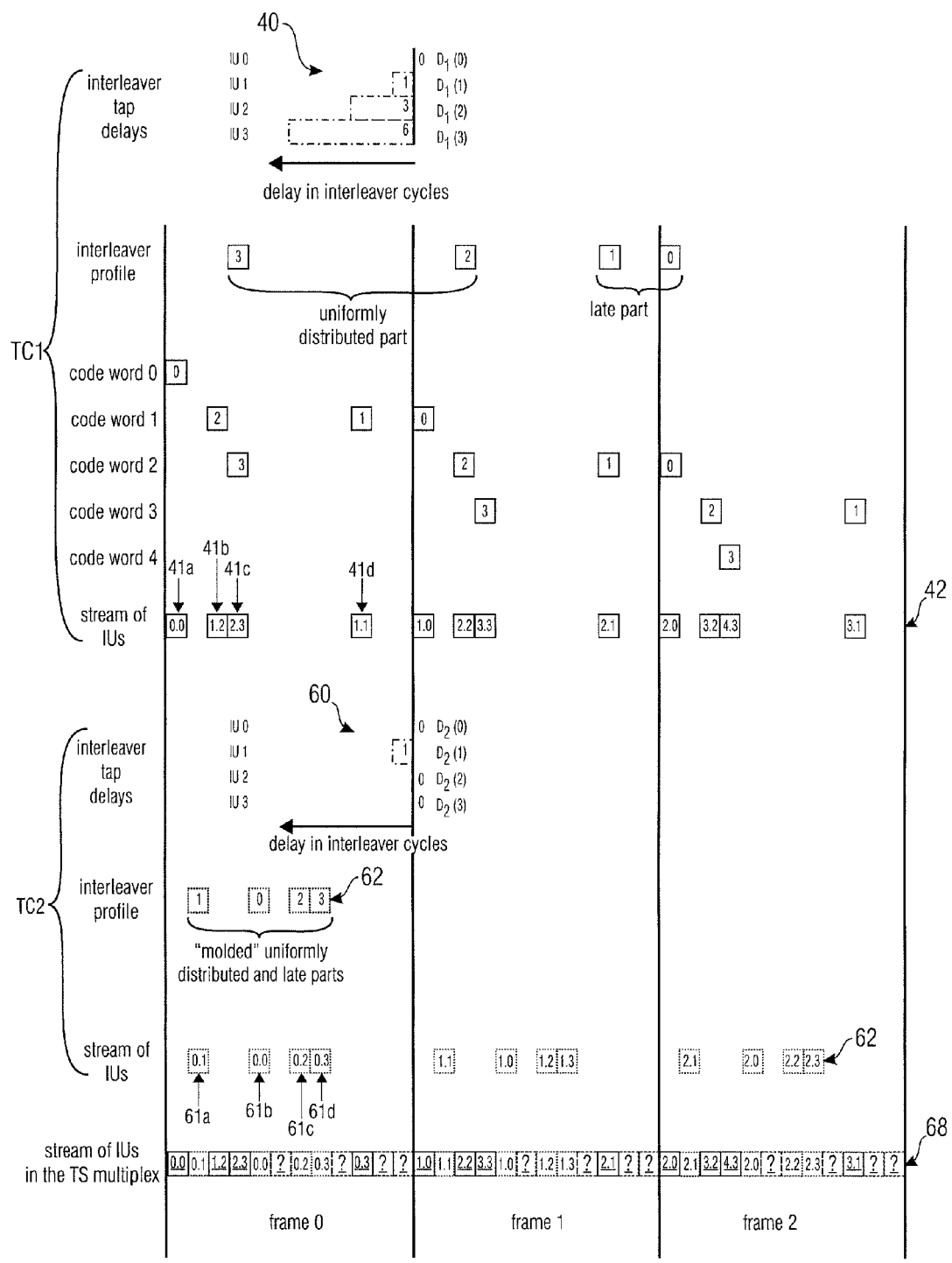
FIG. 6 shows a schematic representation of an advantageous joint transmission of first and second transport channels via a joint transmission channel, in accordance with an embodiment of the present invention.

FIG. 6 shows a schematic representation of an advantageous joint transmission of first and second transport channels via a joint transmission channel in accordance with an embodiment of the present invention.

The configuration of the first transport channel TC1 corresponds to the configuration that has already been described with reference to FIG. 4. This means that the interleaver specification 40 of the first interleaver for TC1 corresponds to the interleaver specification of FIG. 4, which defines first transmission resources 41 for the joint transmission, so as to obtain interleaved first code words, each of which comprises an altered sequence of first interleaver units.

The second transport channel TC2 cannot be transmitted in an entirely uninterleaved manner, but with temporally short interleaving. An interleaver associated with the second transport channel TC2 comprises a second interleaver specification 60, which defines second transmission resources 61 for the joint transmission, so as to obtain an interleaved second code word 62 which comprises an altered sequence of second interleaver units. The second interleaver specification 60 is derived from the first interleaver specification 40, so that the second transmission resources 61 are different from the first transmission resources 41.

Since the multiplex of the transport channels TC1, TC2, or of their respective IUs, should repeat itself in each transmission frame, and since each transmission frame comprises three interleaver cycles in this example, the second interleaver specification 60 may be derived from the first one in that the delays of the parallel delay lines of the first interleaver are taken modulo three interleaver cycles. The resulting second interleaver specification 60 accordingly has a maximum delay of one interleaver cycle (line 1), which is less than one transmission frame.

If one cyclically applies the second interleaver specification 60 with the same period of three interleaver cycles to the code words of TC2, the stream of interleaved interleaver units of TC2 will follow exactly the same pattern as TC1, with the exception that it is shifted by one interleaver cycle. The time pattern of TC2 will be the same (only shifted) as that of TC1 when the second interleaver specification 60 is derived from the first interleaver specification 40 in the above-described manner, i.e. in that the first interleaver specification 40, or the first delay profile, is taken modulo one period length L (in interleaver cycles) of its input sequence. In the example depicted in FIG. 6, the input sequence consists of a code word (=an interleaver cycle) of TC1, a code word (=an interleaver cycle) of TC2, and an idle interleaver cycle. The same repeats itself over and over again, so that the period duration L here amounts to three interleaver cycles. If the period duration L is utilized for the modulo operation, the result, i.e. the output sequence in accordance with the first and/or second interleaver specification, will necessarily also be periodic and have the same period duration L, so that there are no conflicts between the interleaver units of the TC1, those of the TC2, and any unused interleaver units.

The interleaver units of the second transport channel TC2 (IU stream 62) now fit very nicely into the time slots that are left free by the first transport channel TC1 (IU stream 42). Due to this adaptation of the shape of the second transport channel TC2 to that of the first transport channel TC1, this specific real-time interleaving may also be referred to as "molded", i.e. "fitted-in", interleaving. Within the multiplex signal 68, unused transmission resources in the form of time slots are again marked by "?". Upon closer observation, one will recognize that both interleaver units of the first transport channel TC1 and interleaver units of the second transport channel TC2 would fit perfectly into the unused time slots "?", so that the full capacity of the transmission frame may be used by the multiplex of the first and second transport channels.

In the above-described example, the period duration L of three interleaver cycles corresponds exactly to the duration of one transmission frame. This is only an option, however the period length L need not necessarily correspond to the duration of a transmission frame. The period duration L may also be selected to correspond to a fraction of the duration of a transmission frame, or to a multiple of the duration of a transmission frame. In said cases, too, embodiments of the present invention would achieve the result desired.

The scenario shown in FIG. 7 leans on the scenario of FIG. 5, i.e. the configuration of the first transport channel corresponds to the configuration that was already explained with reference to FIG. 5.

The interleaver means, associated with the first transport channel TC1, for altering the sequence of the first interleaver units comprises a first interleaver specification 50 which defines first transmission resources 51 for joint transmission, so as to obtain interleaved first code words 52 comprising an altered sequence of the first interleaver units.

Figure 7:
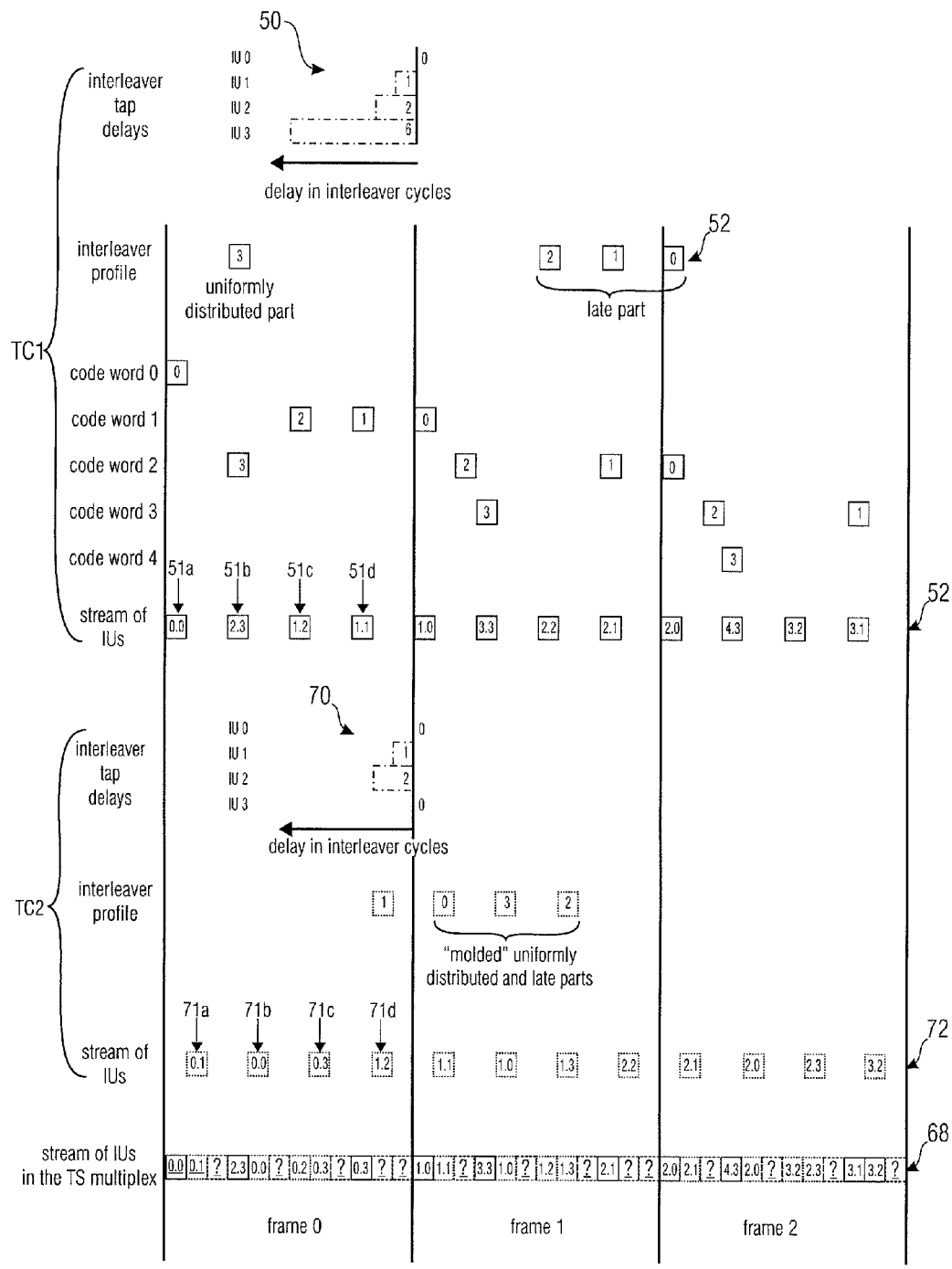
FIG. 7 shows a schematic representation of an advantageous joint transmission of first and second transport channels via a joint transmission channel, in accordance with a further embodiment of the present invention.

Even in the example depicted in FIG. 7, a second interleaver specification 70 of a second interleaver means, which is associated with the second transport channel TC2, is derived from the first interleaver specification 50 such that second transmission resources 71 are different (disjoint) from the first transmission resources 51. In this case, too, the transmission resources are time slots within a transmission frame.

Since in this case, too, there is a period duration L of three interleaver cycles, the individual line delays $D_2(n)$ (e.g. n= 0 . . . N−1) of the second interleaver specification 70 are obtained in that the first line delays of the first interleaver specification 50 are taken modulo L=3 in each case, i.e. $D_2(n)=D_1(n) \mod L$. As may be seen, also in present scenario, the IU stream 72 of the second transport channel TC2 fits very nicely into the time gaps of the IU stream 52 of the first transport channel TC1. Just like in FIG. 6, no collisions occur, and the unused IUs, or their associated time slots, may be assigned to either TC1 or TC2.

With reference to FIGS. 6 and 7, it has also been shown that embodiments of the present invention
  (a) can ensure backward compatibility for interleaved broadcasting services, and
  (b) may provide flexible throughput allocation for any services transmitted (unused IU transmission resources may be associated with any transport channel, and used IU transmission resources may be re-occupied).

In addition, embodiments of the present invention exhibit the following properties:
  The interleaver specification, or the interleaver profile, of the second transport channel TC2 does not need to be signalized since it may be derived and/or calculated, on the receiver side, from known parameters. Only a number of code words (or a number of interleaver cycles or IUs) per transmission frame of the first transport channel TC1, and possibly a code rate of TC2, need to be transmitted, since TC2 starts after TC1. For example for DVB-SH, these parameters fit well into the 32 RFU bits of the signaling field SF, which are protected by a CRC-16.
  A slightly more sophisticated embodiment will be obtained when the code words of the TC1 are transmitted in a specific pattern, and the gaps are padded with the code words, or IUs, of TC2. This is just as backward compatible as the option wherein the code words of the first transport channel follow one another. The advantage of this approach consists in that an overall delay of the second transport channel may be reduced since some of the delay of storing the code words of the second transport channel before they are transmitted may be avoided. A minor disadvantage consists in that slightly more complex signaling of this pattern and, therefore, a few additional bits within the signaling field become needed.

It has been shown, with reference to FIGS. 6 and 7, that embodiments of the present invention will work if the code rates for transport channels TC1 and TC2 are identical. However, since code word lengths are multiples of interleaver cycles, and since by means of embodiments of the present invention individual interleaver cycles may be assigned to either of transport channel TC1 or transport channel TC2, the inventive concept also works for different code rates between transports channels TC1 and TC2.

A shorter latency will be possible when the multiplex of info words (IW) is periodic (e.g. four IWs of the transport channel TC1, five IWs of the transport channel TC2, so that the period duration is 9 IWs or, e.g., 27 interleaver cycles) and has a shorter period duration L than the duration of a transmission frame (e.g. 81 interleaver cycles), and when this period is upheld even beyond transmission frame limits. In the present example, the latency would be 27 interleaver cycles/period/81 interleaver cycles/transmission frame, which corresponds to a latency of 1/3 transmission frames/period, i.e. 1/3 transmission frames. However, this introduces a certain granularity for the share of the second transport channel TC2: the period of 9 IWs should be upheld to avoid reconfiguration of TC2. Specifically, when the period L changes, the second interleaver specification will also change, since it is derived, while utilizing the period L, from the first interleaver specification. Such a reconfiguration of the interleaver of TC2 typically signifies a data loss and is therefore undesirable. Therefore, only IWs within this period can be interchanged between TC1 and TC2. Thus, for the present example, a granularity of 11% of the overall throughput is achieved. The number of IWs per transmission frame, or of interleaver cycles per transmission frame, depends on the OFDM mode used (bandwidth and degree of modulation) and on the bandwidth, the roll-off, the degree of modulation and the code rate of the TDM (time-division multiplex). Depending on this number, specific periodicities may be achieved. I.e., specific latency times are possible, whereas others are not. An improved mechanism as described above may be employed to reduce the latency. It will need additional signaling, which indicates the numbers of IWs of the first transport channel TC1 and of the second transport channel TC2 per period and, possibly, a specific repetition pattern.

Figure 8A:
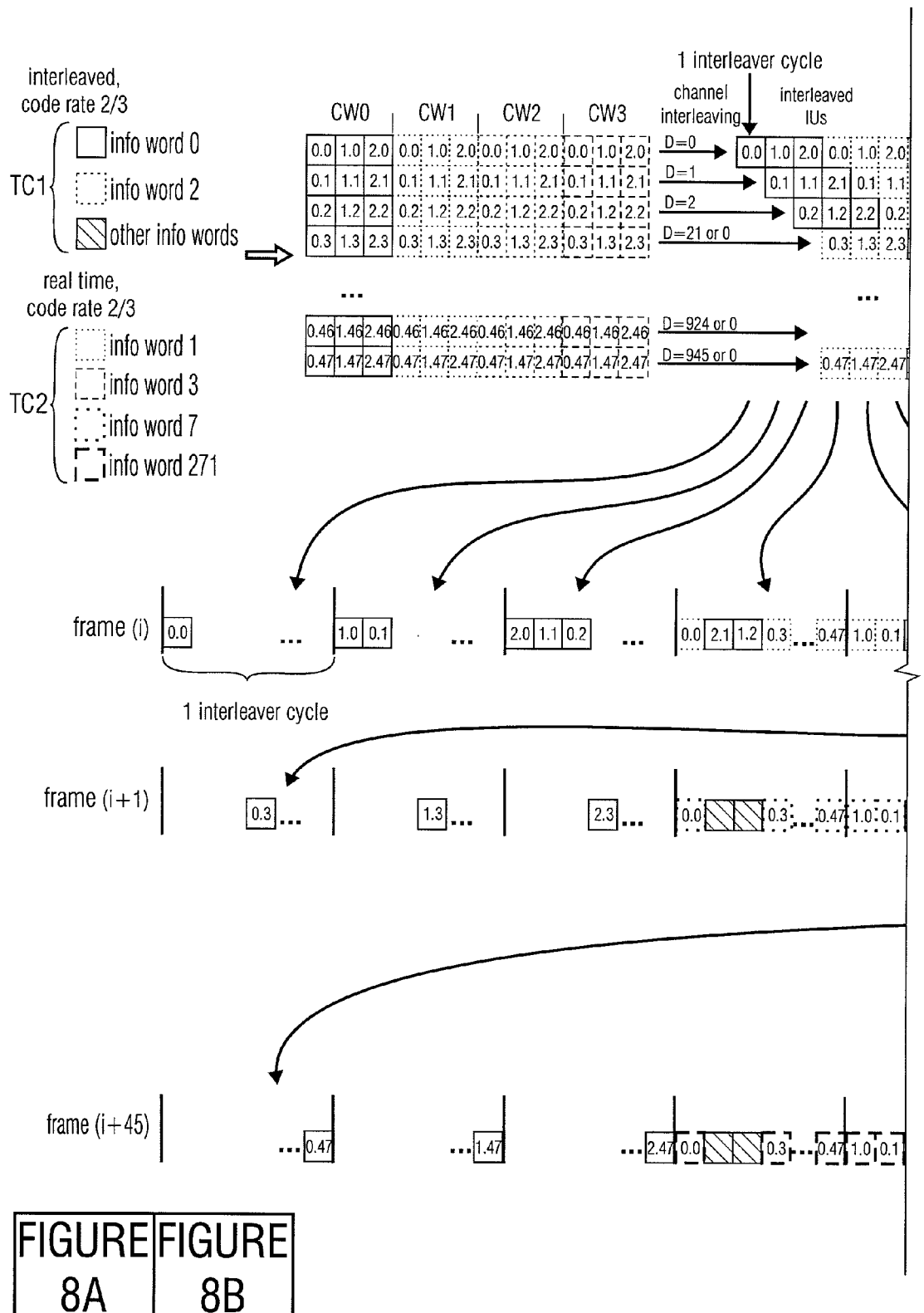
FIG. 8 shows a schematic representation of an advantageous joint transmission of first and second transport channels via a joint transmission channel, in accordance with a further embodiment of the present invention.
Figure 8B:
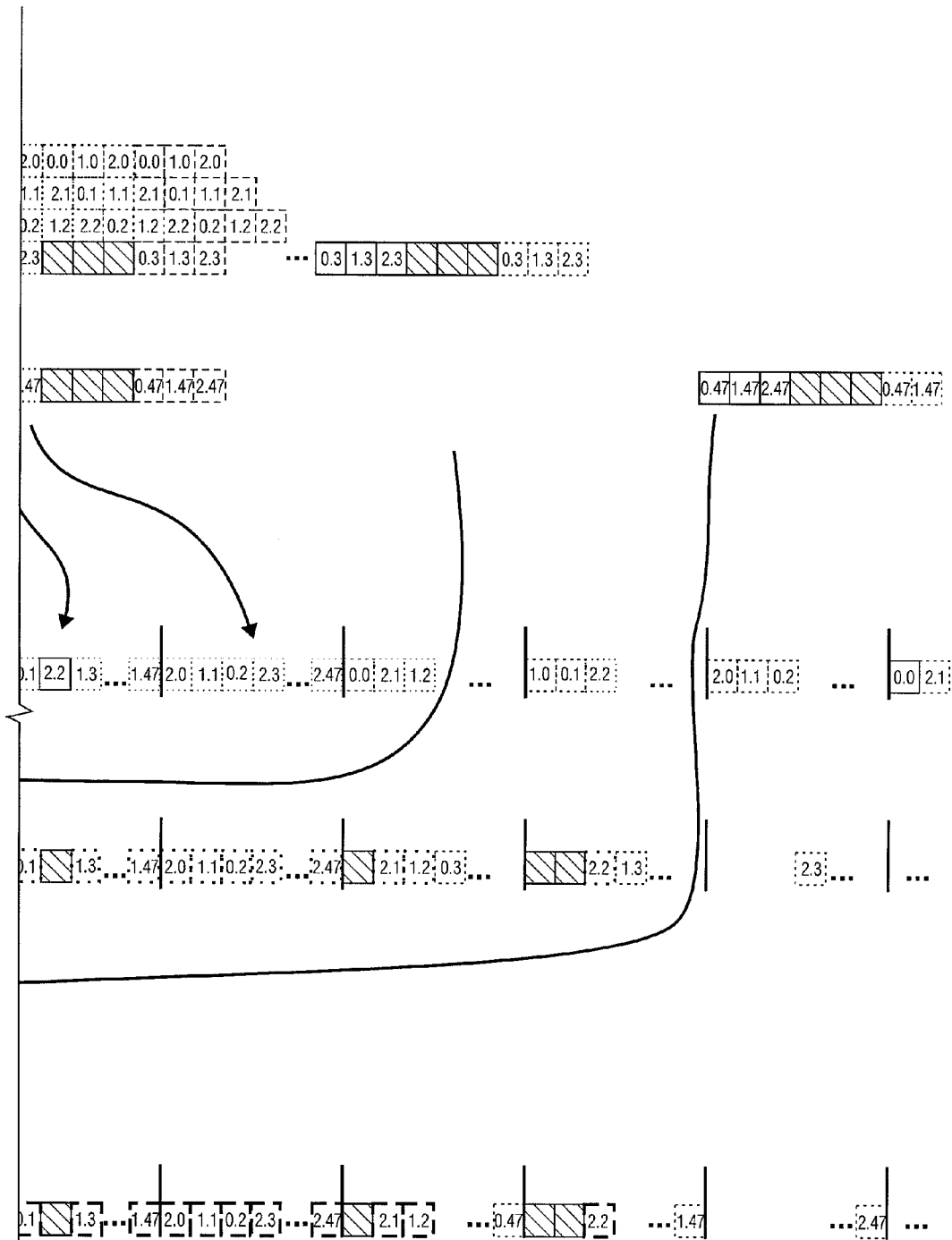

FIG. 8 shows a further example of how the inventive concept ("molded" interleaving) may work.

First code words (CW0 and CW2) of an interleaved first transport channel, and second code words (CW1 and CW3) of a real-time transport channel are to be found, in an alternating manner, within a multiplex. In a first interleaver cycle, N=48 IUs of the $0^{th}$ column of the CW0 are applied to the delay lines of a first interleaver with a first interleaver profile. In a second interleaver cycle, the IUs of the $1^{st}$ column of the CW0 are applied to the delay lines of the first interleaver. In a third interleaver cycle, the IUs of the 2$^{nd}$ column of the CW0 are applied to the delay lines of the first interleaver.

In a fourth cycle, the N=48 IUs of the CW1, which belongs to the real-time transport channel TC2, are applied to the delay lines of a second interleaver with an altered second interleaver profile. In the example shown in FIG. 8, the second interleaver profile for the real-time transport channel is obtained from the first interleaver profile of the first transport channel in that the delays of the first interleaver profile are taken modulo 21.

In a seventh interleaver cycle, again N=48 IUs of the CW2, which belongs to the interleaved transport channel TC1, are applied to the first interleaver or are switched, again, from the second real-time interleaver profile to the first interleaver profile. Thus, no collision whatsoever will occur. While code words CW0 and CW2 are transmitted within the transmission frames i to i+45 (the overall delay therefore being 45 transmission frames), the code words CW1 and CW3 are transmitted only within the transmission frame i. Now, code word CW7 of TC2 may be transmitted within the transmission frame i+1 to the same transmission resources (time slots) in which the info word 1 was previously transmitted, because CW1 needs no more time slots within this transmission frame. Within the frame i+45, the code word 271 of the TC2 of the real-time transport channel may be transmitted at the corresponding locations.

If, by means of modifying the current DVB-SH standard, it is intended that not only two QoS requirements are to be achieved, such as robustness for the transport channel TC1 and real time for the transport channel TC2, as was described above, but further QoS requirements are to be met, further transport channels similar to the ETSI SDR standard (ETSI=European Telecommunications Standards Institute, SDR=Satellite Digital Radio) may be introduced. This is possible, in principle, since a sufficient number of RFU bits are provided within the signaling field to achieve this. Such extensions, however, are currently limited to the TDM mode only, since a corresponding signaling field is not provided for in the OFDM mode. This is why only the satellite connection of DVB-SH can meet several QoS requirements. Despite this, the present invention is naturally not limited to this, as any person skilled in the art will easily recognize.

If there are two transport channels, the interleaver profile of the second additional transport channel may be obtained from the interleaver profile of the first transport channel in accordance with the above-described modulo operation, i.e. $D_2(i)=D_1(i) \mod [M(i)*L]$, M(i) being any integer, and for the index i of the delay line within the respective interleaver. If further transport channels having different QoS requirements are needed, such a simple derivation of the interleaver profiles from the interleaver profile of the first transport channel will no longer be readily possible, however. Even though the interleaver profiles of all the transport channels may still be derived from the interleaver profile of the first transport channel, a more complex specification and more complex signaling is to be used to this end.

If it is assumed that the period length of the input to the interleaver amounts to L interleaver cycles, i.e. the input pattern of the code words of the transport channel TC1, the transport channel TC2, the transport channel TC3, etc. is repeated every L interleaver cycles (for example, L might correspond to the duration of a transmission frame in interleaver cycles). In this case, for example, transport channel TC3 might utilize an interleaver profile wherein $D_3(1 \ldots 5)=D_1(0 \ldots 5) \mod L$, $D_3(6 \ldots 23)=D_1(6 \ldots 23) \mod 2L$ and $D_3(24 \ldots 47)=D_1(24 \ldots 47) \mod 4L$. Accordingly, the interleaver profile of the transport channel TC3 would be derived from the interleaver profile of the transport channel 1 and would have a maximum delay of 4L. This configuration, or interleaver specification, may be communicated to a receiver by means of the signaling field SF.

In addition to the modulo operation already described, there is a further possibility of deriving the interleaver specifications from the first interleaver specification in that, as a further interleaver specification, one adds an individual offset, for each delay line, to the first interleaver specification, or subtracts the former from the latter, i.e. $D_2(i)=D_1(i) \pm M(i)*L$. This procedure also results in that the various transport channels fit nicely into one another. If one comes back to the above example, wherein the input period length amounts to L interleaver cycles, the delays of an interleaver associated with the transport channel TC4 might be calculated as follows: $D_4(0 \ldots 5)=D_1(0 \ldots 5)+L$, $D_4(6 \ldots 23)=D_1(6 \ldots 23)+2L$ and $D_4(24 \ldots 47)=D_1(24 \ldots 47)-3L$. Such embodiments of the present invention result in a backward-compatible multiplex signal, wherein the transmission resources of the transport channel TC1 are not touched. The more complex parameters are signaled to a receiver.

Figure 9A:
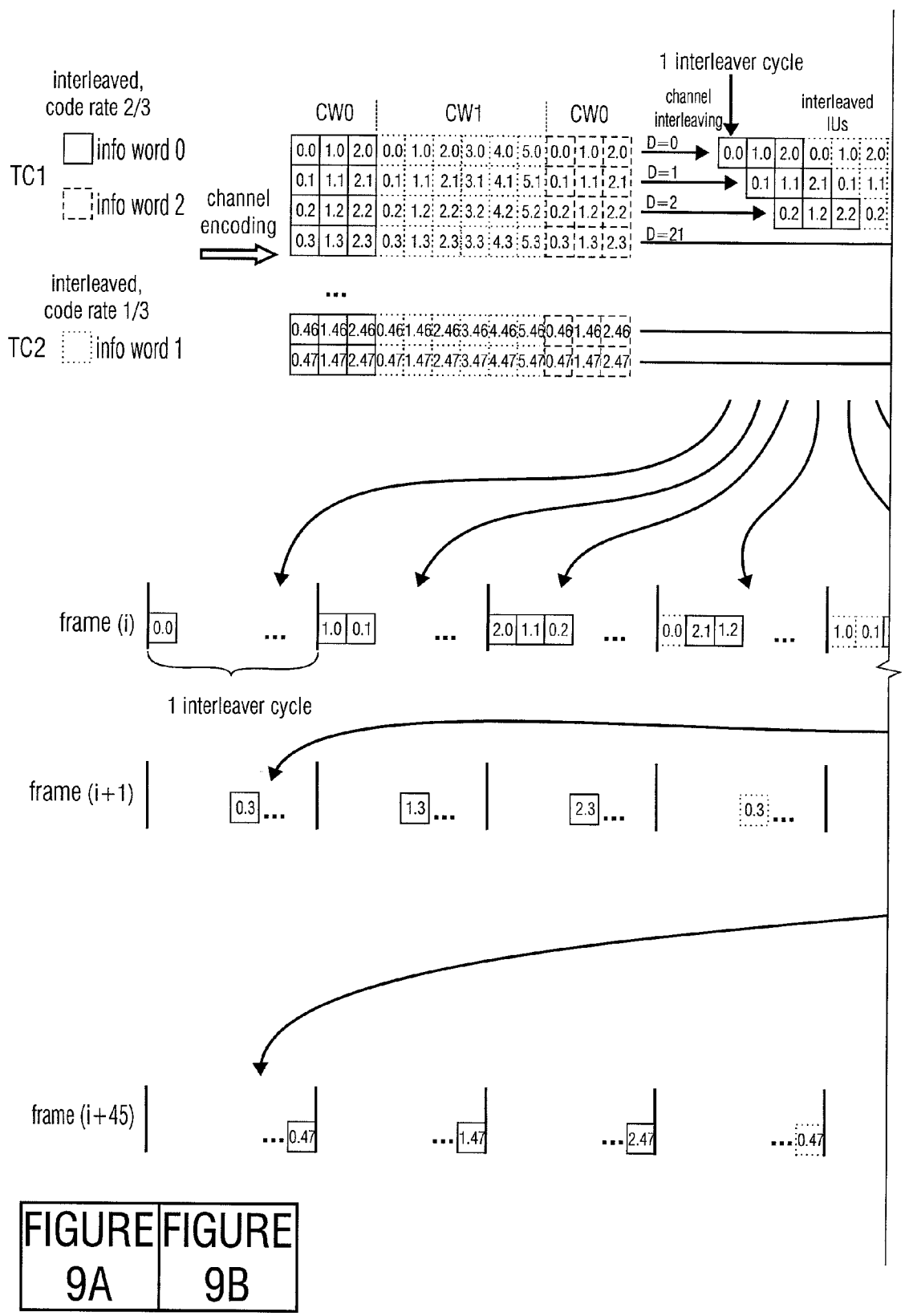
FIG. 9 shows a schematic representation of an advantageous joint transmission of first and second transport channels at different code rates via a joint transmission channel, in accordance with an embodiment of the present invention.
Figure 9B:
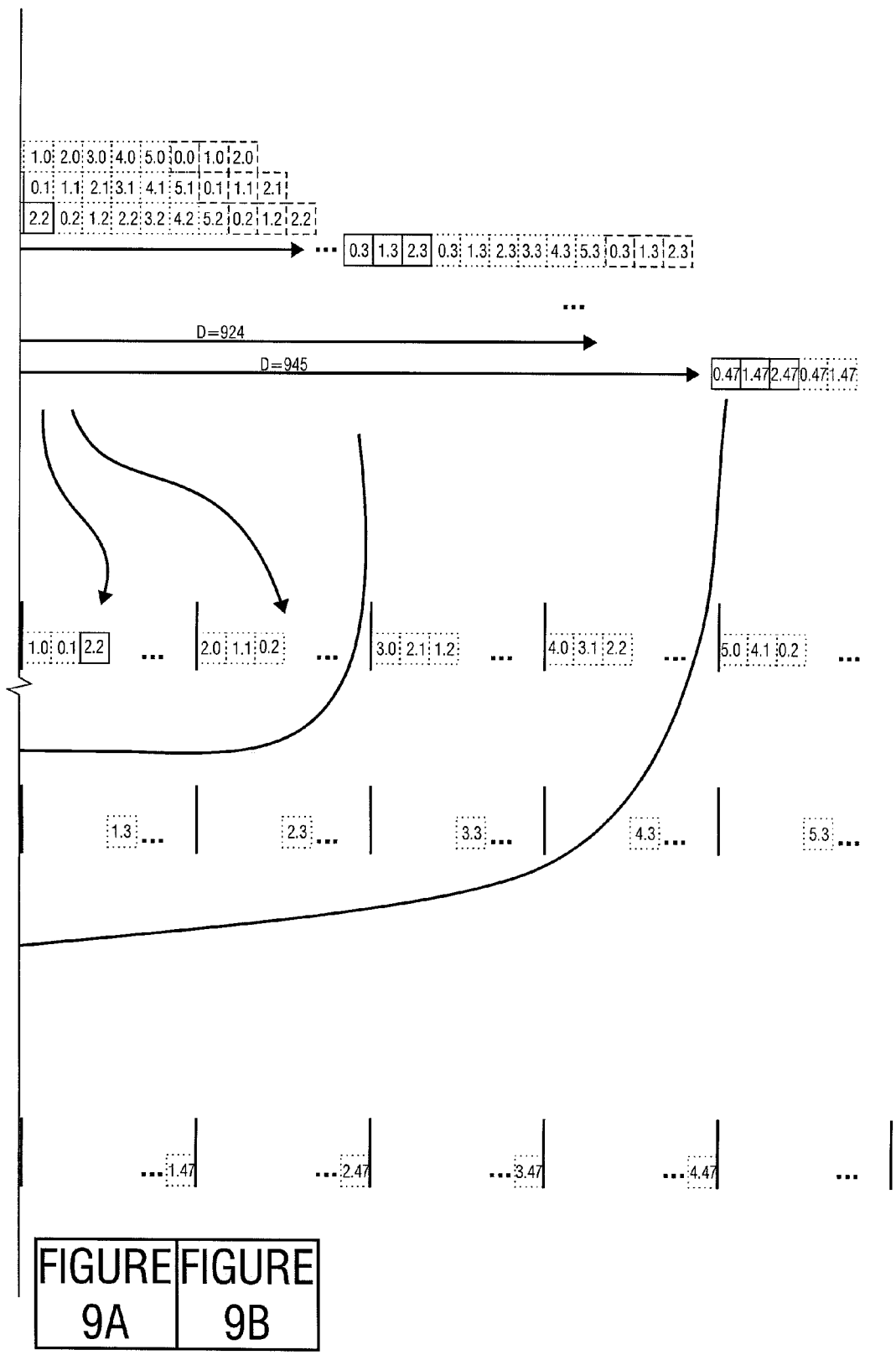

FIG. 9 shows a possibility of how one can obtain transport channels having various levels of robustness by using several transport channels having different code rates.

In the example shown, the info words IW0 and IW2 are encoded at a code rate of 2/3 so as to obtain code words CW0 and CW2, and the info word IW1 is encoded at a code rate of 1/3 so as to obtain code word CW1. The interleaver profile, or the interleaver specification, is identical for both transport channels, i.e. $D_2(0 \ldots N-1)=D_1(0 \ldots N-1)$.

One will recognize that also in the example shown in FIG. 9, no collisions whatsoever occur between the IUs of the various transport channels, and that the code words CW0 and CW2 of the transport channel TC1 are transmitted within the same time slots within which they would have been located even without the second transport channel TC2 being present. The additional second transport channel TC2 having the code rate CR=1/3 simply occupies some of the interleaver cycles which would otherwise have belonged to the transport channel TC1.

From that point of view, further transport channels might be introduced also in a backward-compatible manner by means of this embodiment, in addition to the existing first transport channel TC1. However, conventional receivers would attempt to decode also the code words of the second transport channel TC2 with the parameters of the first transport channel (i.e. code rate CR=2/3). This would entail decoding failure, so that the code words, or information words, from the transport channel TC2 would simply be ignored by such receivers.

Figure 10A:
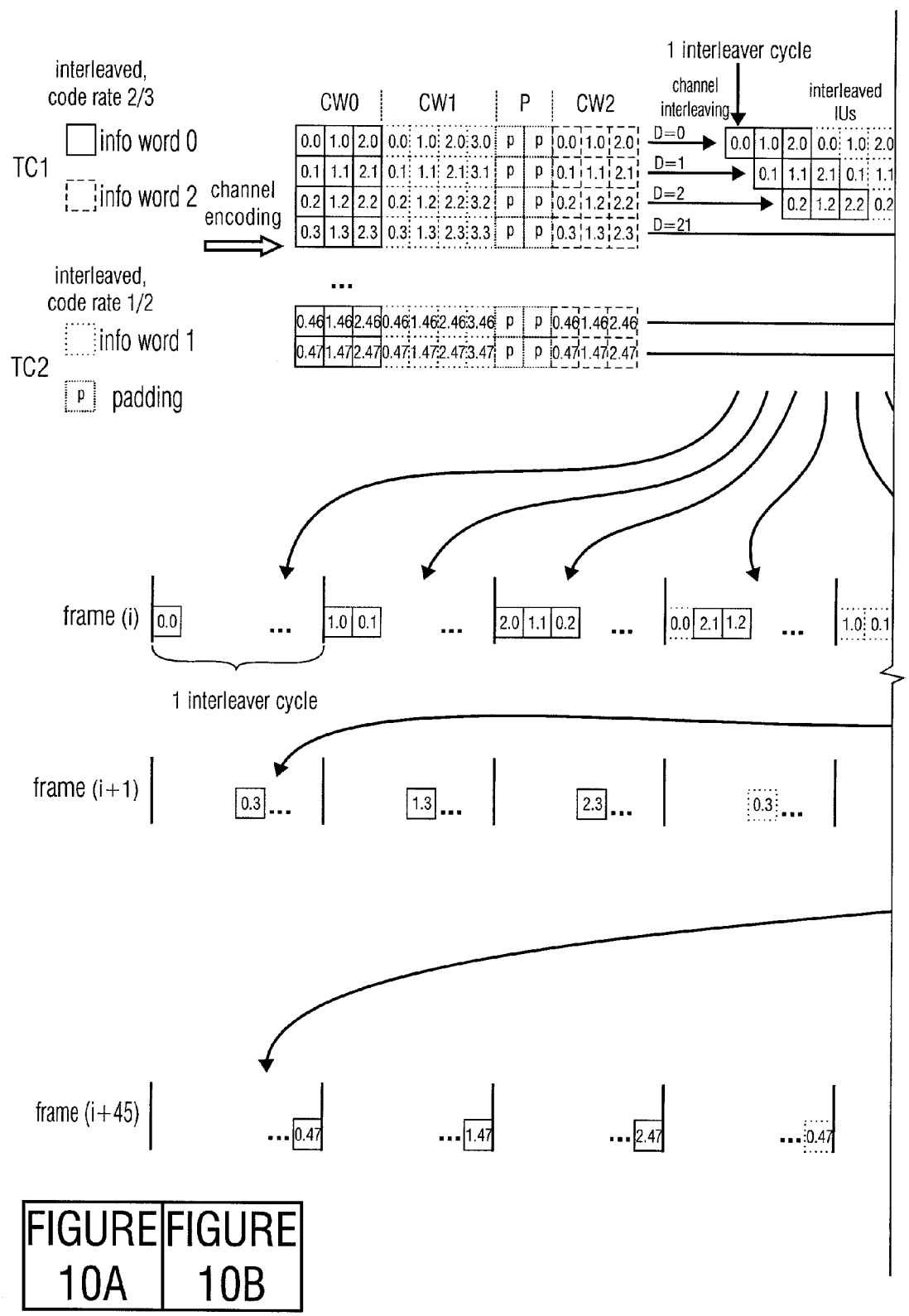
FIG. 10 shows a schematic representation of an advantageous joint transmission of first and second transport channels at different code rates via a joint transmission channel, in accordance with a further embodiment of the present invention.
Figure 10B:
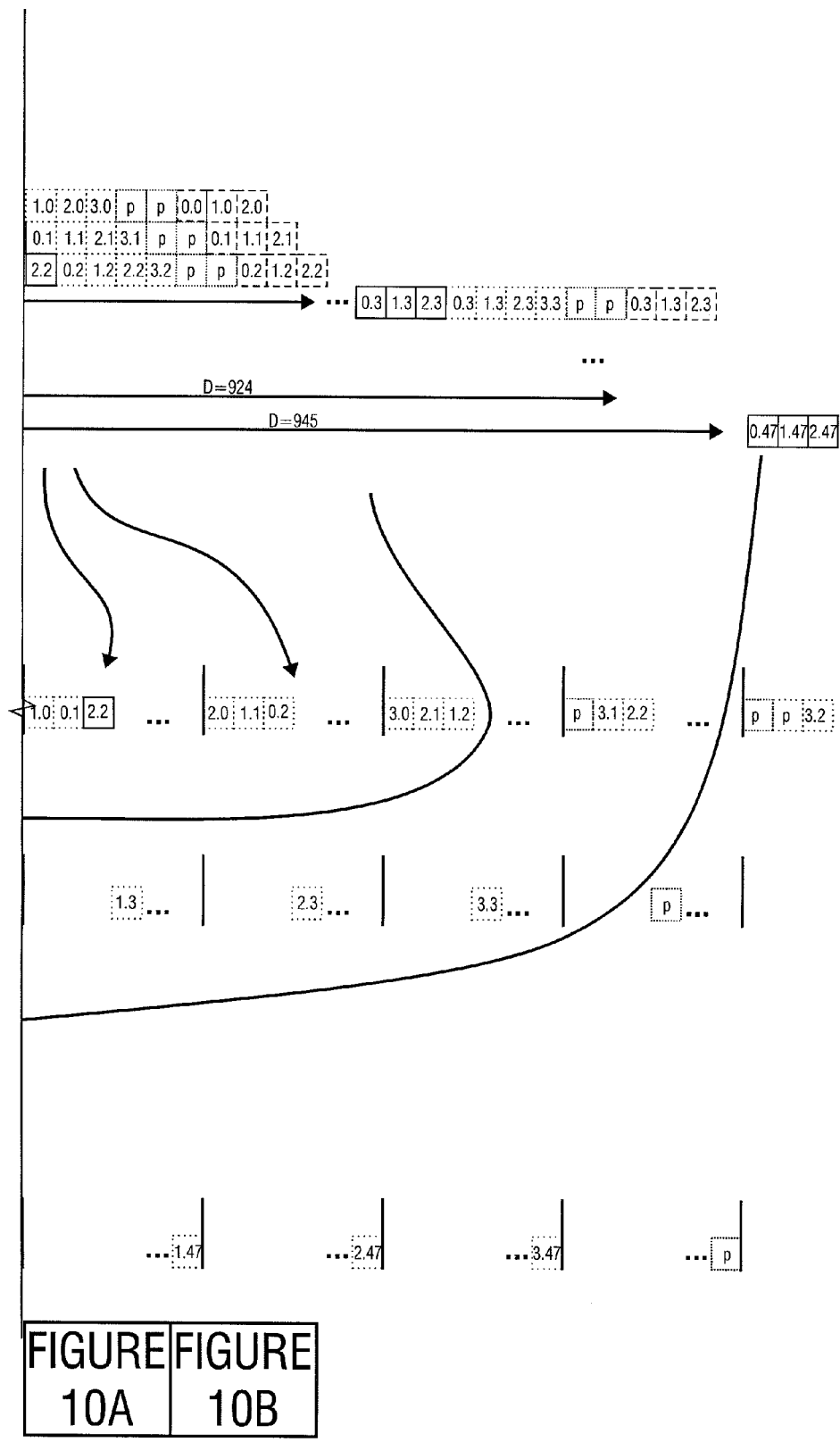

FIG. 10 depicts that with some combinations of code rates of the transport channels TC1 and TC2, so-called padding or zero padding (filling up with zeros) is to be introduced.

In the example depicted, transport channel TC1 continues to use the code rate 2/3, whereas transport channel TC2 uses the code rate 1/2. The positions of the two code words CW0 and CW2 of the transport channel TC1 are fixed. This means that the point in time when the code words CW0 and CW2 will be supplied to the first interleaver is predetermined. The code word CW1 of the transport channel TC2, however, does not completely fill in the resulting (time) gap. This is why a transmitter in this case introduces padding, in accordance with embodiments, so as to ensure that the code word CW2 starts at the original position, i.e. after nine interleaver cycles. In the present case, 2N zeros, which correspond to two interleaver cycles, are attached to the code word CW1, so that the predefined order of the code words may be maintained. In this manner, it can be ensured that conventional receivers can sort and process the code word CW2 correctly.

Figure 11:
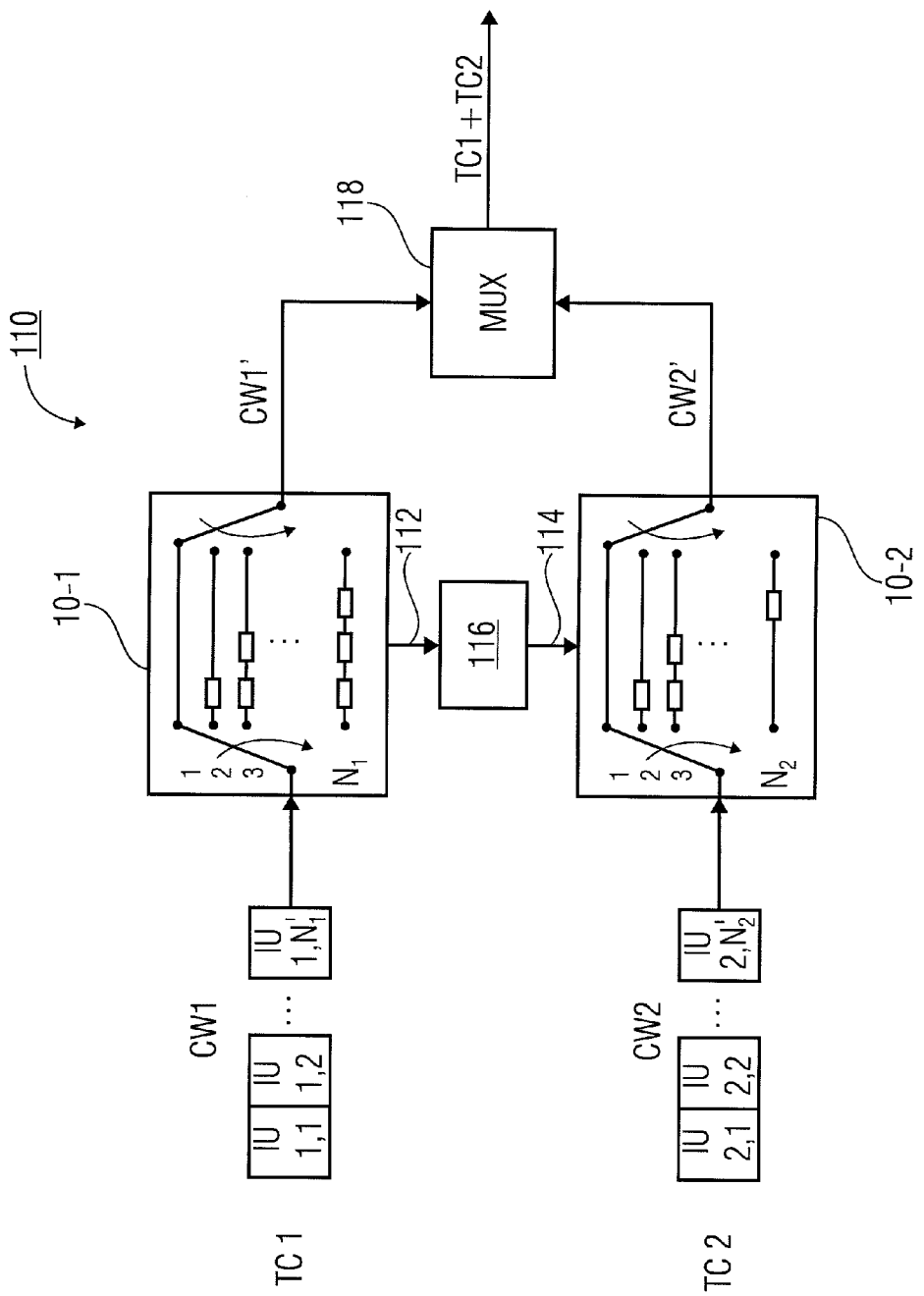
FIG. 11 shows a schematic representation of an interleaver device in accordance with an embodiment of the present invention.

FIG. 11 schematically shows an interleaver device 110 in accordance with an embodiment of the present invention.

The interleaver device 110 serves for transmitting a first and a second code word CW1, CW2 via a transmission channel in a joint manner, the first code word CW1 comprising a sequence of first interleaver units IU(1,1), IU(1,2), ..., IU(1,$N_1$), and the second code word CW2 comprising a sequence of second interleaver units IU(2,1), IU(2,2), ..., IU(2,$N_2$), each interleaver unit comprising at least one bit, or symbol. The first code word CW1 belongs to a first transport channel, and the second code word CW2 belongs to a second transport channel.

The interleaver device 110 comprises a first interleaver means 10-1 for altering the sequence of the first interleaver units IU(1,1), IU(1,2), ..., IU(1,$N_1$) in accordance with a first interleaver specification 112, which defines first transmission resources for joint transmission, so as to obtain an interleaved first code word CW1' comprising an altered sequence of first interleaver units. In addition, the interleaver device 110 comprises a second interleaver means 10-2 for altering the sequence of the second interleaver units IU(2,1), IU(2,2), ..., IU(2,$N_2$) in accordance with a second interleaver specification 114, which defines second transmission resources for joint transmission, so as to obtain an interleaved second code word CW2' comprising an altered sequence of second interleaver units. The second interleaver specification 114 is derived from the first interleaver specification 112, so that the second transmission resources are different from the first transmission resources. In addition, the interleaver device may comprise a derivation means 116 for deriving the second interleaver specification 114 from the first interleaver specification 112.

The interleaver device 110 has a combiner, or multiplexer, 118 connected downstream from it so as to multiplex the interleaved first and second code words CW1', CW2' in accordance with the first and second transmission resources onto the transmission channel, specifically in such a manner that first and second interleaver units of the interleaved first and second transport channels TC1, TC2, each of which goes back to a code word of the first and second transport channels, are arranged, within the transmission stream, at the first and second transmission resources such that they are mutually interleaved, as has already been shown with reference to the preceding figures.

As has already been described above, the transmission resources may be time slots of a transmission frame, for example, if the multiplex method is a time-division multiplex method. However, if the multiplex method is a frequency-division multiplex method, for example, the transmission resources may also be frequency bands or frequency carriers.

In accordance with an embodiment, each of the two interleaver means 10-1, 10-2 comprises one convolutional interleaver, respectively, so as to interleave the first and second code words CW1, CW2. Code words which comprise such convolutional interleavers for interleaver units have already been described with reference to FIG. 2. Advantageously, the number of the first interleaver units $N_1$' might correspond to an integer multiple of the number $N_1$ of the delay lines of the first convolutional interleaver 10-1. By analogy, the same goes for the number of the second interleaver units $N_2$' and the number $N_2$ of delay lines of the second convolutional interleaver 10-2. Of course, there are still several restrictions to the degrees of freedom: a period (which is now calculated in terms of the number of IUs instead of interleaver cycles) is to be an integer multiple of $N_1$, $N_2$, $N_1$', and $N_2$'. In addition, this period is to be an integer multiple (>1) of a partial period, which is a multiple of all of the four variables N1, N2, $N_1$', and $N_2$'. However, $N_1$' need not necessarily be a multiple of $N_1$, and vice versa, etc. On these conditions, any partial period within the period may be assigned to either TC1 or TC2.

In a time-division multiplex method, i.e. when the joint transmission of the first and second code words CW1, CW2, or CW1', CW2', respectively, takes place within a time interval (transmission frame), the interleaver specifications 112, 114 each represent delay specifications, or delay profiles, of the respective interleaver 10-1, 10-2. Due to the individual delays $D_1(n)$ (e.g. n=0,1,2, ... N) of the first delay lines, and due to the delays $D_2(n)$ of the second delay lines, transmission resources are specified, in each case, in the form of time slots, within which the interleaver units of the respectively associated code word CW1, CW2 are transmitted.

In an embodiment of the present invention, the first code word CW1 belongs to a transport channel (pipe), which is transmitted in an interleaved manner. The second code word CW2 belongs to a second transport channel, which is subject to real-time requirements and is therefore transmitted in a manner in which it is only slightly interleaved over time. Therefore, a largest delay of the second interleaver specification 114, or of the second interleaver profile, is smaller than a largest delay of the first interleaver specification 112, or the first interleaver profile, so that the second code word CW2 is transmitted at a lower latency than the first code word CW1. This may be achieved, for example, in that the $n^{th}$ delay $D_2(n)$ of the second interleaver specification 114 is derived from the $n^{th}$ delay $D_1(n)$ of the first interleaver specification 112 in accordance with $D_2(n)=[D_1(n) \bmod (M(n)*L)]$, wherein L represents the period duration that was already described above, and M(n) signifies a natural number, which may be different for each delay line. A further possibility is to derive the $n^{th}$ delay $D_2(n)$ of the second interleaver specification 114 from the $n^{th}$ delay $D_1(n)$ of the first interleaver specification 112 in accordance with $D_2(n)=[D_1(n)\pm(M(n)*L)]$.

The derivation specification for deriving the second interleaver specification 114 from the first interleaver specification 112 may be implemented, in terms of hardware and/or software, by the derivation means 116.

Those skilled in the art will readily appreciate that any of the blocks shown in the figures may be implemented both as hardware and as software for controlling processors and storage devices.

Figure 12:
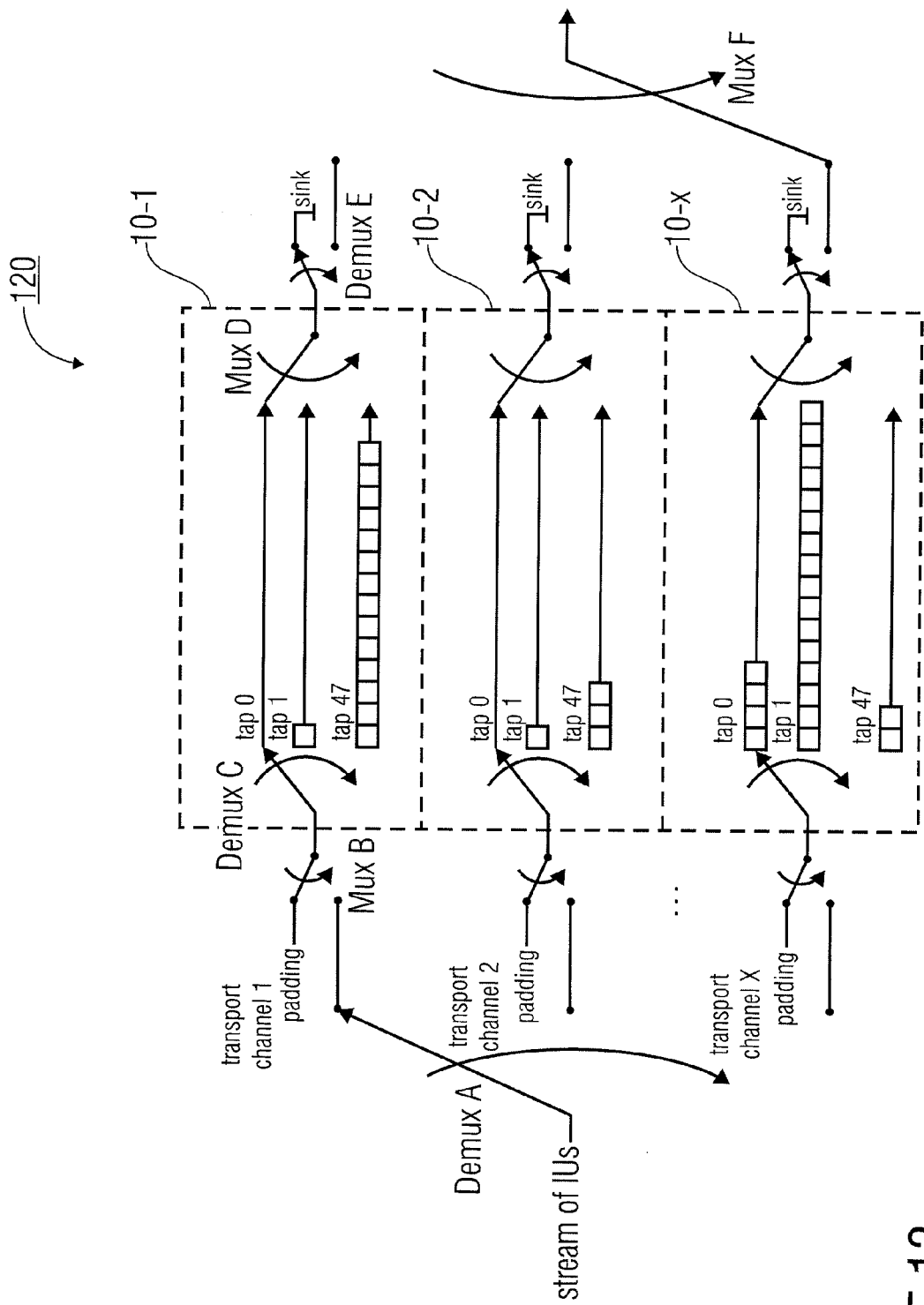
FIG. 12 shows a schematic representation of an interleaver device in accordance with a further embodiment of the present invention.

FIG. 12 shows an embodiment of how the inventive concept described may be implemented in a transmitter. FIG. 12 shows only details of an interleaver device 120 when several transport channels (pipes) exist.

A transmitter has a channel encoder (e.g. turbo encoder), which may generate code words at a dynamically configurable code rate, contained therein that is not depicted here, is located upstream from the interleaver device 120, and the transmitter possibly has a bit interleaver contained therein so as to interleave bits within a code block generated by the channel encoder within the block. These two modules (which are not depicted) are controlled, just like the channel interleaver 120 depicted, such that the code words or code blocks run in a mutually synchronized manner, i.e. that the block boundaries are known correctly and that switching from parameters such as code rate, interleaver specification, etc., for each transport channel (pipe) occurs at a correct point in time.

In the example of the channel interleaver 120 depicted in FIG. 12, a stream of interleaver units (IUs), which belong, in sections, to code words of all of the transport channels (pipes), are distributed over X pipes. The order of the code words (or their associated IUs) is predefined by the transmitter such that a desired periodicity is achieved: e.g. N1 code words of pipe 1, N2 code words of pipe 2, N3 code words again of pipe 1, N4 code words of pipe 3, etc., until at some point, N1 code words of pipe 1 are again present, and the cycle starts from the beginning The period duration may correspond to a transmission frame, a fraction of a transmission frame, or a multiple of a transmission frame.

In synchronization with this sequence of code words, or IUs, a first demultiplexer A distributes the code words among transport channel-specific interleavers 10-1, 10-2, ..., 10-X. I.e., each pipe has its own interleaver with, e.g., N=48 delay lines (taps). The demultiplexer A remains at the same position for an entire code word. The delays in the delay lines of the transport channel-specific interleaver are individually derived, in accordance with the above-mentioned considerations, from the interleaver specification of the first transport channel in each case.

A multiplexer B selects, for each pipe interleaver 10-x (x=1, ... ,X), whether an IU to be supplied to the pipe interleaver 10-x stems from the stream of code words or whether it is a padding IU. Padding IUs are needed for two purposes:
  a) For time steps wherein no code word IUs are available because the demultiplexer A currently does not select this pipe, but another one. This ensures that, in each time step, an IU is fed into all of the pipe interleavers 10-x (x=1, ... ,X).
  b) For padding short code words, as was described with reference to FIG. 10. This is needed for the case where a sequence of code words of this pipe is input into a pipe interleaver 10-x (x=2, ... X), and for the case where the entire length of this sequence is not an integer multiple of $Z_1*N_1$ IUs, wherein $Z_1$ is the number of interleaver cycles per code word, and $N_1$ is the number of delay lines of the interleaver for pipe 1. In this case, padding IUs are used for padding until a multiple of $Z_1*N_1$ IUs has been padded. In these padding time steps, all of the other pipe interleavers are also padded with padding IUs. This padding may possibly also be performed, rather than for each individual pipe, at the end of an entire sequence of code words (i.e. after several pipes) which do not belong to pipe 1. For this purpose, the padding IUs might also be inserted by a dedicated module, for example downstream from the channel encoder or upstream from the channel interleaver 120.

A demultiplexer C consecutively writes IUs into the delay lines (taps) of a respective pipe interleaver 10-x (x=1, ... ,X) in a cyclic manner. The demultiplexers C of all of the pipes will select the same tap of their interleaver in each case in each time step (e.g. all of them will select tap 3).

The multiplexers D are accurately synchronized with the demultiplexers C in each case, i.e. they are connected to the same delay line, respectively, as the corresponding demultiplexer C.

A multiplexer F jumps back and forth, IU by IU, between the outputs of the individual pipe interleavers 10-x (x=1, ... ,X), i.e. at least one IU is read from an output at a time, and subsequently a different output of a different pipe interleaver is possibly selected. The order of the outputs selected is not necessarily sequential from pipe 1 to X, but it is derived from
  a) the input sequence of the code words of the different pipes (which is periodic, as we know), and
  b) the interleaver profile of transport channel 1, or of pipe 1.

Let p[i] be the sequence of the pipe indices for each interleaver cycle i at the input of the channel interleaver 120, i.e. the $0^{th}$ interleaver cycle that has been input (i.e., e.g., the first 48 IUs, which accordingly are part of the $0^{th}$ code word input) belongs to pipe p[0], the $10^{th}$ interleaver cycle (is part of the $4^{th}$ code word, for example) belongs to pipe p[10], etc. p[i] is periodic and has the period L. In addition, let $D_x(0 ... 47)$ be the interleaver profile, i.e. $D_1(n)$ is the delay (in interleaver cycles) of the $n^{th}$ delay line (tapped delay line) of the interleaver 10-1.

If m is the index of the current interleaver cycle, which is written into and/or read out from the channel interleaver 120, the order of the pipes selected by the multiplexer F will be $$p[m-D_1(0)], p[m-D_1(1)], p[m-D_1(2)], \ldots, p[m-D_1(47)].$$

For the demultiplexers E, it is to be stated that all of them will lead to a sink (i.e. the corresponding IU will be discarded) if the associated pipe is not selected by the multiplexer F in this time step. By means of the device described with reference to FIG. 12, it can be ensured that only such padding IUs which were needed only within the pipe interleavers 10-x (x=1, ... ,X) will arrive at the sink, so as to ensure mutual synchronization of the individual pipes.

Figure 16:
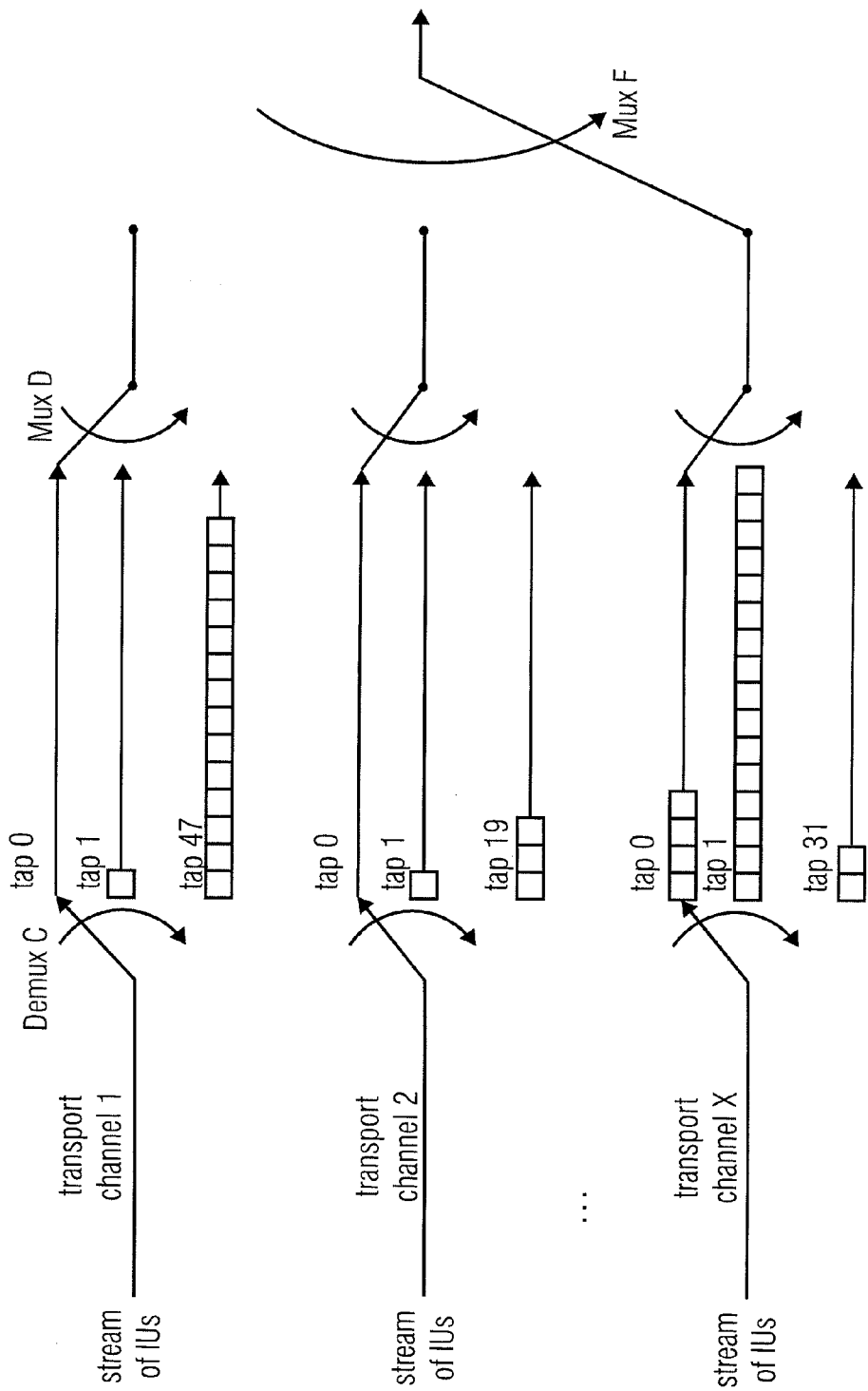
FIG. 16 shows a schematic representation of a conventional interleaver device.

With ETSI SDR, the transmitter basically looks like the representation given in FIG. 16. Each pipe may place its code words/IUs into an interleaver of its own which is configured in an entirely individual manner (it being possible for the number of taps to be different as well), and the demultiplexers C, typically need not be synchronized with one another. At the output of the convolutional interleaver, multiplexer F will then tap the IUs in a configured pattern, e.g. 1000 IUs of TC1, then 1000 IUs of TC2, etc. Of course, this number might also be 1 IU rather than 1000 IUs. If fewer code words of TC1 and more code words of TC2 are to be transmitted, the multiplexer F will be controlled differently.

Figure 13:
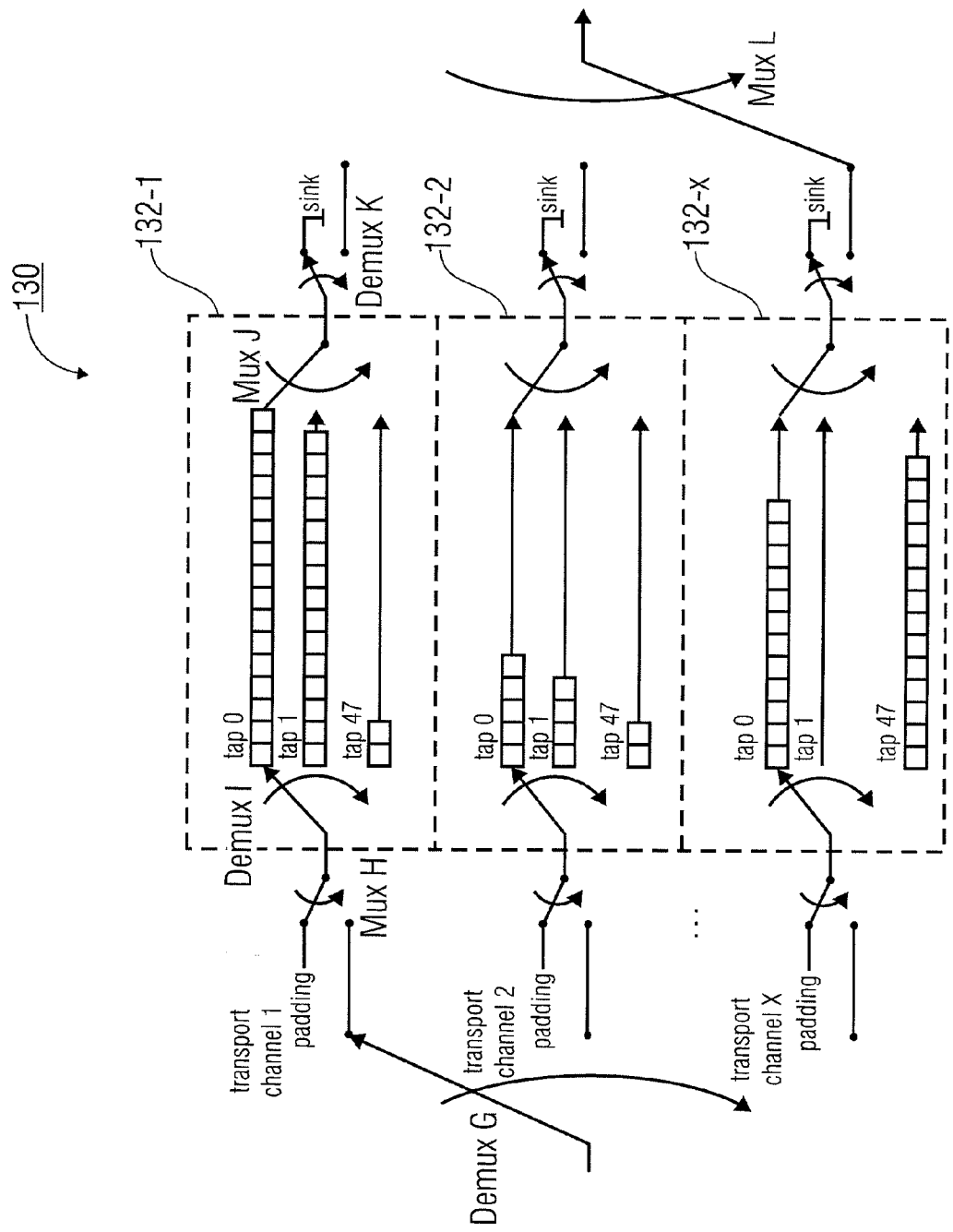
FIG. 13 shows a schematic representation of a de-interleaver device in accordance with an embodiment of the present invention.

FIG. 13 shows a schematic representation of a receiver 130 for receiving a multiplex signal generated with a transmitter-side interleaver device 120. The representation in FIG. 13 corresponds to a de-interleaver device which corresponds to the interleaver device of FIG. 12.

With the de-interleaver device 130, an extractor, or demultiplexer, G is operated in an IU-wise manner and synchronously with the combiner, or multiplexer, F of the channel interleaver 120. This means that after applying an IU to a pipe de-interleaver 132-x (x=1, ... ,X), the demultiplexer G may switch to an input of a different pipe de-interleaver. The chronological order is the same as with the multiplexer F.

Just like the multiplexers B, the multiplexers H insert padding IUs for those time steps in which the respective pipe de-interleaver 132-x (x=1, ... ,X) is not selected by the demultiplexer G. Thus, the multiplexers B reverse the discarding of padding IUs in the demultiplexers E of the interleaver device 120.

The demultiplexers I and the multiplexers J work analogously with the demultiplexers C and multiplexers D of the transmitter-side interleaver device 120, and consecutively write the IUs into the N delay lines (taps) of the pipe de-interleavers in a cyclic manner. The pipe de-interleavers 132-x (x=1, ... ,X) represent the de-interleavers belonging to the respective pipe interleavers 10-x (x=1, ... ,X) within the transmitter. The delays of the individual taps, or delay lines, of the pipe de-interleavers 132-x are selected such that for a tap x, the sum of the delays within the transmitter and the receiver (which is referred to as an end-to-end delay of channel interleaving of this pipe x) is a constant. The end-to-end delay of pipe x therefore comprises both the transmitter-side delay $D_x(n)$ of the $n^{th}$ delay line of the interleaver and a receiver-side delay $D_x'(n)$ of the $n^{th}$ delay line of the de-interleaver 132-x. For a pipe x, this constant is $a_x*L+b$, $a_x$ being any value for pipe x, and b being an additional delay shared by all pipes. L is the period of the code word sequence at the transmitter-side channel interleaver input in interleaver cycles.

A multiplexer L operates synchronously to (however, possibly with a fixed offset from) the demultiplexer A within the transmitter and reads entire interleaver cycles (N IUs) from the currently selected pipe de-interleaver 132-x (x=1,...,X). It follows the predefined periodic pattern of code words transmitted by the transmitter, i.e. N1 code words of pipe 1, N2 code words of pipe 2, etc. The offset between the demultiplexer A and the multiplexer L (e.g. the multiplexer L reads the seventh interleaver cycle of a period when the demultiplexer A writes the first interleaver cycle, thereafter the eighth interleaver cycle is read while the second interleaver cycle is written, etc.) may be directly derived from the additional delay b (see above) of the pipe de-interleaver 132 within the receiver 130, and ensures that the multiplexer L will read the correctly de-interleaved code words rather than the dummy IUs.

The demultiplexers K lead IUs to the sink in those time steps when the respective pipe de-interleaver 132-x (x=1,...,X) is not selected by the multiplexer L. Therefore, they destroy those padding IUs introduced by the multiplexer H which are only needed for mutually synchronizing the individual pipe (de-)interleavers. In addition, a demultiplexer K may also lead IUs to the sink when the multiplexer L is selecting the associated pipe, but if the current IU is only a padding IU that has been inserted by the multiplexer B within the transmitter for padding excessively short code words. However, this functionality may also be performed by a block which is located downstream from the channel de-interleaver 130 depicted here and is located upstream from the channel decoder (not shown).

In FIG. 13, the receiver-side de-interleaver means is configured to alter, in addition to the sequence of the second, additionally transmitted interleaver units, also the sequence of the first interleaver units of the first transport channel in accordance with a first de-interleaver specification, which is inverse to the first interleaver specification, so as to obtain a first de-interleaved code word at the output. Altogether, therefore, code words are provided at the output of the receiver or de-interleaver 130 in that order in which they were applied to the interleaver 120 on the transmitter side—i.e. in a non-interleaved manner.

The extractor, or demultiplexer, G knows the transmitter-side sequence of first and second code words, as well as the first interleaver specification, so as to associate the correct pipe with the incoming interleaver units in each case. To this end, an inventive receiver may have a means for providing de-interleaver information from which at least the second de-interleaver specification for the second pipe may be derived. In this context, the de-interleaver information may comprise information about the transmitter-side sequence of first and/or second code words and about the first interleaver specification, the de-interleaver information being received as side information in addition to the multiplex signal. In this manner, the first and/or second de-interleaver specification(s) become(s) configurable, since both the first and the second de-interleaver specifications may be derived from the first, transmitter-side interleaver specification. This may be effected by the means for providing the de-interleaver information.

In accordance with embodiments, a receiver comprises a working memory into which the multiplex signal may be stored. The de-interleaver means 132 may comprise a memory controller configured to read out the working memory to memory addresses that may be obtained by the first and/or second de-interleaver specification(s), so as to obtain the de-interleaved first and/or second code word(s). This means, both the extractor and the de-interleaver means may be implemented by a memory controller of address generator so as to associate corresponding first and second memory areas to the incoming interleaver units of the interleaved first and second code words. Thus, in some embodiments, sorting and de-interleaving the transport channels entirely takes place, in accordance with the transport channel sequences and the de-interleaver and/or interleaver specifications, within the working memory of the receiver, which is ideal, as it were, for software-based implementations.

What is not shown in FIG. 13 are downstream bit de-interleavers and channel decoders.

Figure 14:
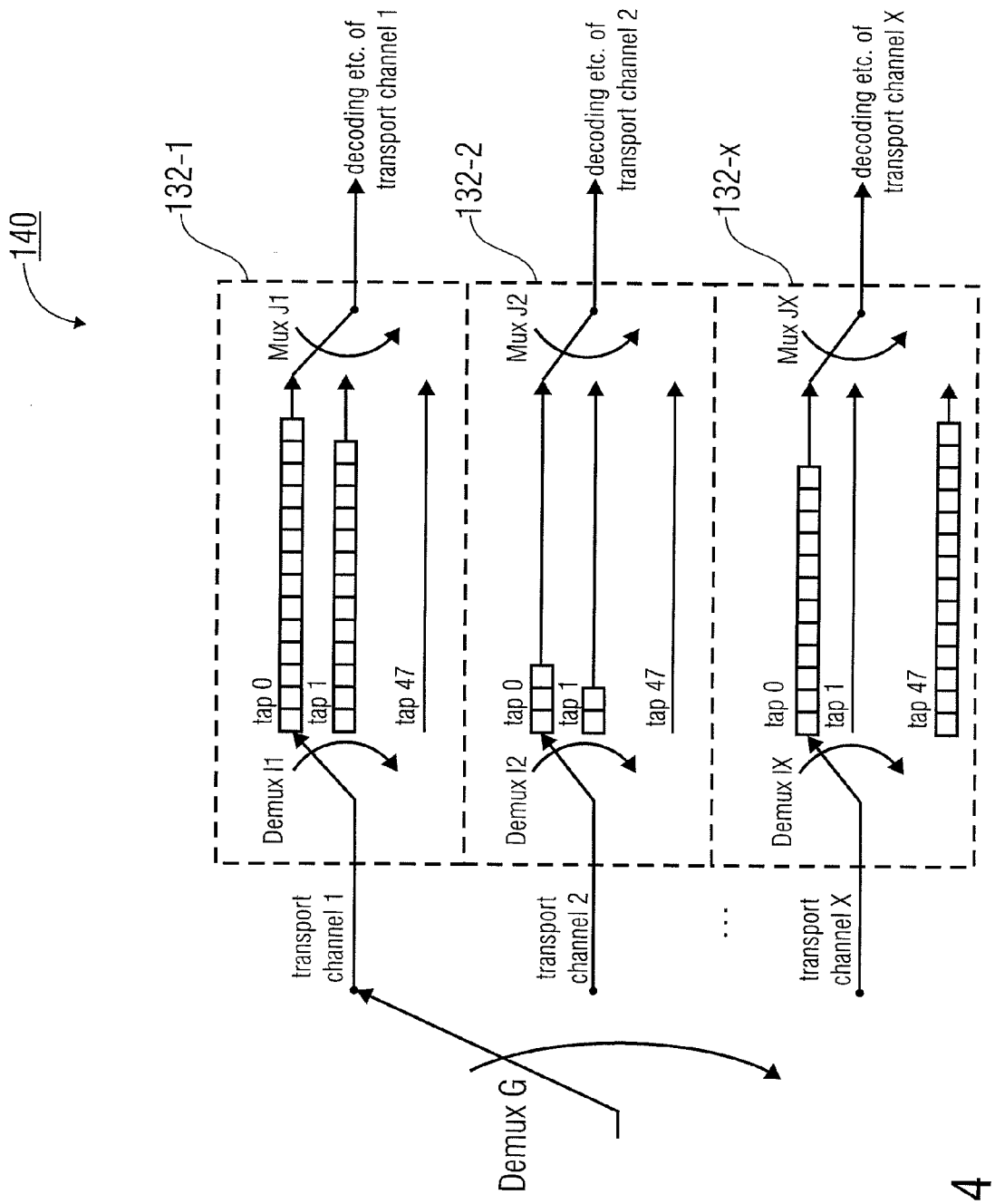
FIG. 14 shows a schematic representation of an de-interleaver device in accordance with a further embodiment of the present invention.

FIG. 14 shows a different embodiment of a receiver 140, wherein the stream of the de-interleaved code words is not longer combined, on the output side, using a multiplexer, but wherein each transport channel (pipe) is processed (e.g. decoded, etc.) individually. Unlike the embodiment described with reference to FIG. 13, the present embodiment thus comprises processing several pipes in parallel. Said parallel processing may also mean that the several pipes are processed consecutively by a single processing block, however the several pipes are processed in a completely separated manner, as if several processing blocks process the data independently of one another.

In this example, it is not in each time step that an IU is written into the de-interleaver 132-x of each pipe x, and no more padding IUs are needed. In exchange, this embodiment needs more complex and individual control of each individual pipe demultiplexer $I_x$ and multiplexer $J_x$, and a specific calculation specification for the delays of all of the delay lines of a pipe de-interleaver 132-x. This means that not all of the demultiplexers $I_x$ (and the multiplexers $J_x$) still run synchronously with one another, but are allowed to jump between the individual delay lines of a de-interleaver 132-x, and that the sum of the delays of all of the delay lines of the transmitter and the receiver is not necessarily a constant. To make up for this, however, the delays may be selected such that the minimum delay equals zero in each pipe.

With reference to the example of FIG. 8, controlling the receiver-side demultiplexer $I_2$ for de-interleaving the info word 1 of the real-time transport channel 2 would be as follows:

IU 0,0→demultiplexer $I_2$ selects tap 0,
what follows are two IUs (2,1 and 1,2) of the code word 0 of the other pipe 1. For these IUs, nothing is written into the de-interleaver 132-2 of pipe 2.
IU(0,3) to IU(0,47)→demultiplexer $I_2$ consecutively selects taps 3 to 47,
IU(1,0)→selecting tap 0
IU(0,1)→tap 1
For the following IU(2,2) of code word 0 of pipe 1, pipe 2 simply stops.
IU(1,3) to IU(1,47)→taps 3 to 47
IU(2,0)→tap 0
IU(1,1)→tap 1
IU(0,2)→tap 2
IU(2,3) to IU(2,47)→taps 3 to 47
What follows now is IU(0,0) of code word 2 of pipe 1. Pipe 2 stops.
IU(2,1)→tap 1
IU(1,2)→tap 2
What follows then are many IUs of code word 2 of pipe 1. Pipe 2 stops.
IU(2,2)→tap 2.

On the read side of the pipe de-interleaver, i.e. on the output side, there is a period of waiting for such time until an entire interleaver cycle is complete, and then all of the taps are read immediately one after the other in the order from 0 to 47.

For correctly de-interleaving the IUs of this code word 1, the de-interleaver 132-2 comprises, for this example, the following delays (in interleaver cycles):

For reading the first interleaver cycle, taps 0 and 3 to 47 comprise the delay 2, tap 1 comprises the delay 1, and tap 2 comprises the delay 0. Reading is performed immediately after the interleaver cycle, when IU(0,2) is being written.

For reading the second interleaver cycle, taps 0 and 3 to 47 again comprise the delay 2, tap 1 comprises the delay 1, and tap 2 comprises the delay 0. Reading is performed immediately after the interleaver cycle, when IU(1,2) is being written.

For reading the third interleaver cycle, taps 0, 1 and 3 to 47 comprise the delay 1, and tap 2 comprises the delay 0. Reading is performed immediately after the interleaver cycle, when IU(2,2) is being written.

Figure 15:
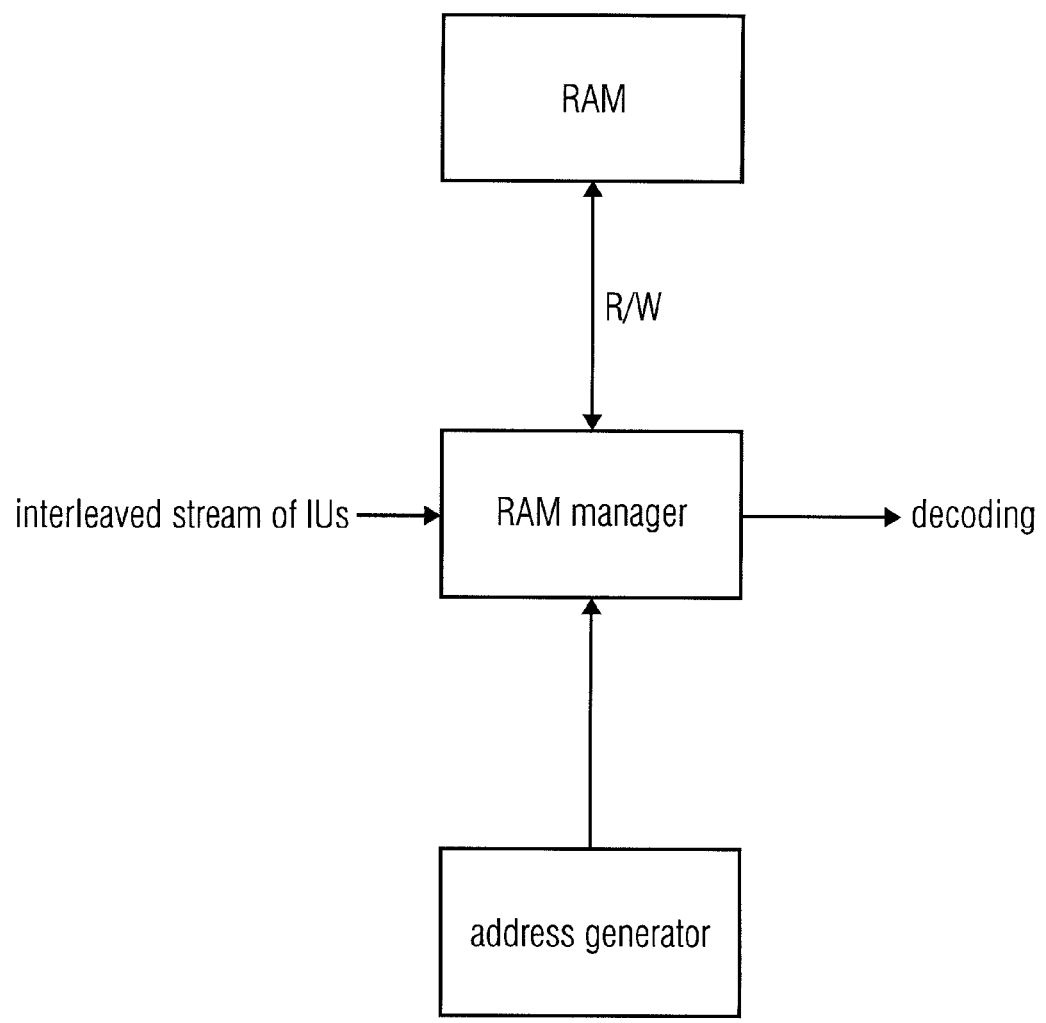
FIG. 15 shows a schematic representation of a RAM-based implementation of the inventive concept.

The description of the multiplexer/demultiplexer and (de-)interleaver blocks in the above examples is to be regarded as functional only. Implementation may also be in the form as is shown in FIG. 15, such that a RAM manager writes the incoming interleaver units into a (internal or external) random access memory (RAM). This applies both to the transmitter side and the receiver side. This means that the RAM, or its memory addresses, then take(s) over the function of the tapped delay lines of the interleaver and/or de-interleaver. A possibility is, for example, for a ring buffer within a RAM memory area to therefore act as a shift register. In accordance with embodiments, a de-interleaver means thus comprises a memory which includes first and second memory areas which have the interleaver units of the interleaved first and second code words in accordance with the first and second de-interleaver specifications supplied to them.

Corresponding write addresses come from an address generator that has to know the sequence of code words, their period L and the interleaver parameters (interleaver/de-interleaver specifications) of each transport channel. I.e., in accordance with embodiments, an inventive receiver may receive information about the transmitter-side sequence of first and second code words as side information in addition to the multiplex signal. Additionally, it might be configured to receive the first interleaver specification as side information in addition to the multiplex signal, so that the first and/or second de-interleaver specification(s) is/are configurable, since the second de-interleaver specification may be derived from the first interleaver/de-interleaver specification and from the period duration of the sequence of first and second code words.

Similarly, the address generator may provide read addresses once a code word has been fully stored, i.e. once all of its IUs are stored within the RAM. In this manner, the entire (de-interleaved) code words are again read out and output. Interleaving and/or de-interleaving is effected by means of a different order of the write and read operations.

The embodiments of the present invention which have been described above enable introducing several transport channels having different QoS properties (e.g. robustness, latency, data rate, etc.) on the physical layer for existing transmission systems wherein only one transport channel has so far been available on the physical layer and which utilize a channel interleaver, in particular a convolutional interleaver. In this context, only transmission resources are taken over, from a first, already existing transport channel, for an additional, second transport channel, at the output of this interleaver such that the transmission resources that have not been taken over remain unchanged (i.e. all of the code words of TC1 remain at the same location as prior to the existence of TC2).

In principle, TC1 initially occupies all of the transmission resources downstream from a convolutional interleaver. Following data rate reduction, however, this is no longer the case. TC2 is transmitted only within those transmission resources which otherwise would be occupied by code words or the associated interleaver units of TC1 (i.e., code words of TC1 are individually re-dedicated, and the associated interleaver units or the associated transmission resources may be used as transmission resources of TC2). Occupying the transmission resources at the transmitter output therefore depends only on the sequence of the interleaver units of TC1 and TC2 at the input of an inventive interleaver device, and on the interleaver profiles. However, occupying the transmission resources is independent of any transmission frame sizes, time slot patterns for entire code words, or the like.

Downstream from the interleaver, the time slots (i.e. the order of arrival of the code words of the respective transport channel) are no longer strictly separated, but (in contrast with ETSI SDR or other standards) are interwoven within the transmitter (the transport channels no longer alternate code word by code word, but IU by IU). Splitting up the receive signal within the receiver is therefore possible not only on the basis of knowing the order of the code words or time slots upstream from the transmitter interleaver, but the first de-interleaver profile is additionally needed. Conversely, de-interleaving is no longer possible only on the basis of knowing the first and/or second interleaver profile(s), but the code word order prior to the transmitter interleaver is additionally needed. By contrast, for ETSI SDR, etc., the splitter/extractor needs exclusively the code word order, and the de-interleavers need exclusively their respective profiles, since for this standard the functionalities of time-division multiplexing and interleaving are completely separate from each other.

In embodiments, the interleaver profile of each transport channel (pipe) may be derived from the interleaver profile of the transport channel 1 via $D_x(n)=D_1(n)$ modulo $[M_x(n)*L]$ with an individual $M_x(n)$ per transport channel x, wherein L is the period length, in interleaver cycles, of the channel interleaver input.

The interleaver profile of each transport channel (pipe) may also be derived from the interleaver profile of the transport channel 1 via $D_x(n)=D_1(n)\pm M_x(n)*L$ with an individual $M_x(n)$ per transport channel x, L being the period, in terms of interleaver cycles, of the channel interleaver input.

Naturally, $M_x(n)$ may also apply, or $M_x(n)=M$, wherein M is the same for all of the transport channels.

Individual code rates per transport channel, or pipe, are possible. Each code word of the input sequence of an inventive interleaver device is allowed to belong, within an arbitrary pattern, to various transport channels. In the event that different interleaver profiles exist within the pipes, this pattern has to be repeated periodically.

If the interleaver profiles of all of the transport channels are identical (i.e. if they differ only in terms of the code rate), the input sequence of the interleaver device need not even be periodic (periodicity is needed only if the pipe interleaver profiles are derived via the above-mentioned calculation specifications ($D_x(n)=D_1(n)$ mod $M_x(n)*L$ or $D_x(n)=D_1(n)\pm M_x(n)*L$)).

In accordance with embodiments, any unused space between a code word of a transport channel (other than transport channel 1) and a code word of transport channel 1 may be padded such that the code word of transport channel 1 starts at the precise location where it would start even without the multiple transport channels.

In accordance with embodiments, all of the needed parameters for the above-indicated processing steps of an inventive receiver are transmitted using the transmit signal.

In particular, embodiments of the present invention may be employed for DVB-SH.

Depending on the circumstances, the inventive methods may also be implemented in hardware or in software. Implementation may be effected on a digital storage medium, in particular a disc, CD or DVD having electronically readable control signals which may cooperate with a programmable computer system such that a method is performed. Generally, the invention thus also consists in a computer program product having a program code, stored on a machine-readable carrier, for performing the method, when the computer program product runs on a computer. In other words, the invention may therefore also be implemented as a computer program having a program code for performing the method, when the computer program runs on a computer and/or microcontroller.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An interleaver device for joint transmission of first and second transport channels via a transmission channel, the first transport channel comprising a sequence of first interleaver units, and the second transport channel comprising a sequence of second interleaver units, each interleaver unit comprising at least one symbol, the interleaver device comprising:
a convolutional interleaver for altering the sequence of the first interleaver units in accordance with a first convolutional interleaver specification, defining first transmission resources for joint transmission, so as to acquire an interleaved first transport channel comprising an altered sequence of first interleaver units, and for altering the sequence of the second interleaver units in accordance with a second convolutional interleaver specification defining second transmission resources for joint transmission, so as to acquire an interleaved second transport channel comprising an altered sequence of second interleaver units,
wherein the second convolutional interleaver specification are derived from the first convolutional interleaver specification, so that the second transmission resources are different from the first transmission resources; and
a combiner for combining the interleaved first transport channel and the interleaved second transport channel in accordance with the first or the second convolutional interleaver specification, so as to acquire a transmission stream for the transmission channel.

2. The interleaver device as claimed in claim 1, wherein the joint transmission of a first code word of the first transport channel and of a second code word of the second transport channel takes place within a time interval, and wherein the first convolutional interleaver specification is a first delay specification defining first points in time for transmitting the altered sequence of the first interleaver units within the time interval, and wherein the second convolutional interleaver specification is a second delay specification which is different from the first one and defines second points in time for transmitting the altered sequence of the second interleaver units within the time interval, so that the first and second points in time within the time interval are mutually interleaved.

3. The interleaver device as claimed in claim 2, wherein a largest delay of the second convolutional interleaver specification is different from a largest delay of the first convolutional interleaver specification, so that the second transport channel is transmitted at a lower or higher latency than the first transport channel.

4. The interleaver device as claimed in claim 1, wherein each of the first and second convolutional interleaver specifications is implemented by:
a plurality of delayers, each comprising a defined delay that essentially equals 0 for a delayer;
an input coupler configured to switch to a different delay means once a number of complete interleaver units have been fed into a delay means;
an output coupler configured to switch from one delay means to a different delay means once a number of complete interleaver units have been received, said number being larger than or equal to 1.

5. The interleaver device as claimed in claim 4, wherein the plurality of delayers comprise a first group of delayers, each of which, apart from a first delayer, is configured to provide a defined first delay or an integer multiple of the defined first delay, and
wherein the plurality of delayers comprise a second group of delayers, each delayer of the second group being configured to provide a defined second delay, which differs from the defined first delay, or an integer multiple of the defined second delay, or to provide the defined first delay or an integer multiple of the defined first delay in addition to the defined second delay or its integer multiple.

6. The interleaver device as claimed in claim 4, wherein a number of delayers in accordance with the second convolutional interleaver specification is an integer multiple of a number of delayers in accordance with the first convolutional interleaver specification, i.e. $N_2 = N_{1*x, N_2}$ being the number of delayers in accordance with the second convolution specification, $N_1$ being the number of delayers in accordance with the first convolutional interleaver specification, and x being an integer.

7. The interleaver device as claimed in claim 6, wherein the delay of the $n^{th}$ delayer in accordance with the second convolutional interleaver specification is derived from the delay of the $(n \bmod N_1)^{th}$ delayer in accordance with the first convolutional interleaver specification, n signifying a natural number, $N_1$ signifying the number of delayers of the first interleaver, and mod signifying the modulo operation.

8. The interleaver device as claimed in claim 4, wherein the defined first delay or the defined second delay are configurable, specifically while using a configuration parameter that allows configuration in integer multiples of an interleaver unit.

9. The interleaver device as claimed in claim 4, wherein the first/second convolutional interleaver specification is a first/second delay specification which assigns a delay to each of the delayers of the first/second interleaver units.

10. The interleaver device as claimed in claim 4, wherein the delayers comprise memory areas, and wherein the couplers comprise memory addressers.

11. The interleaver device as claimed in claim 2, wherein the $n^{th}$ delay $D_2(n)$ of the second delay specification is derived from the (n modulo $N_1$)$^{th}$ delay $D_1$(n modulo $N_1$) of the first delay specification in accordance with $D_2(n)=D_1$(n modulo $N_1$) modulo M(n modulo $N_1$)*L, L signifying a period duration which depends on an order of code words, applied to the interleaver device, of the first and second transport streams, $N_1$ signifying the number of delayers of the first convolutional interleaver specification, and M (n modulo $N_1$) signifying a natural number.

12. The interleaver device as claimed in claim 2, the $n^{th}$ delay $D_2$(n) of the second delay specification being derived from the (n modulo $N_1$)$^{th}$ delay $D_1$(n modulo $N_1$) of the first delay specification in accordance with $D_2(n)=D_1$(n modulo $N_1$)±M (n modulo $N_1$)*L, L signifying a period duration which depends on an order of code words, applied to the interleaver device, of the first and second transport streams, $N_1$ signifying the number of delayers of the first convolutional interleaver specification, and M(n modulo $N_1$) signifying a natural number.

13. The interleaver device as claimed in claim 1, adapted to generate at least the interleaved first transport channel in conformity with DVB-SH (Digital Video Broadcasting-Satellite services to Handheld devices), DVB-H (Digital Video Broadcasting for Handheld devices) or DVB-T (Digital Video Broadcasting-Terrestrial).

14. The interleaver device as claimed in claim 1, wherein the combiner is configured to assign transmission resources to the first transport channel or to the second transport channel in accordance with the following specification:

$$p[m-D_1(0)], p[m-D_1(1)], p[m-D_1(2)], \ldots, p[m-D_1(47)],$$

wherein p[i] is a sequence of indices for each interleaver cycle i at the input of the convolutional interleaver, p[i] being periodic and comprising a period L, wherein $D_x(0 \ldots 47)$ represents an interleaver profile, wherein $D_1(n)$ is the delay, in interleaver cycles, of an $n^{th}$ delay line of the convolutional interleaver.

15. A transmitter for generating a transmit signal, comprising:
an encoder which adds redundancy and comprises a first code rate smaller than 1 and a second code rate smaller than 1, said encoder being configured to generate, from a first information word, a first code word of a first transport channel at the first code rate, and configured to generate, from a second information word, a second code word of a second transport channel at the second code rate;
an interleaver device for joint transmission of first and second transport channels via a transmission channel, the first transport channel comprising a sequence of first interleaver units, and the second transport channel comprising a sequence of second interleaver units, each interleaver unit comprising at least one symbol, the interleaver device comprising:
a convolutional interleaver for altering the sequence of the first interleaver units in accordance with a first convolutional interleaver specification, defining first transmission resources for joint transmission, so as to acquire an interleaved first transport channel comprising an altered sequence of first interleaver units, and for altering the sequence of the second interleaver units in accordance with a second convolutional interleaver specification defining second transmission resources for joint transmission, so as to acquire an interleaved second transport channel comprising an altered sequence of second interleaver units,
wherein the second convolutional interleaver specification are derived from the first convolutional interleaver specification, so that the second transmission resources are different from the first transmission resources; and
a combiner for combining the interleaved first transport channel and the interleaved second transport channel in accordance with the first or the second convolutional interleaver specification, so as to acquire a transmission stream for the transmission channel,
wherein the convolutional interleaver has the first code word supplied to it that is interleaved in accordance with the first convolutional interleaver specification, and wherein the convolutional interleaver has the second code word supplied to it that is interleaved in accordance with the second convolutional interleaver specification; and
a modulator for modulating a data stream, output by the interleaver device, of interleaved first and second code words onto a transmission channel.

16. The transmitter as claimed in claim 15, wherein the first code rate is different from the second code rate.

17. A receiver for receiving a receive signal comprising first and second interleaved code words, the first interleaved code word comprising a sequence of first interleaver units interleaved in accordance with a first convolutional interleaver specification, which first interleaver units belong to a first transport channel, and the second interleaved code word comprising a sequence of second interleaver units interleaved in accordance with a second convolutional interleaver specification, which second interleaver units belong to a second transport channel, the second convolutional interleaver specification being derived from the first convolutional interleaver specification, and the interleaved first transport channel and the interleaved second transport channel being mutually interleaved, in accordance with the first or second convolutional interleaver specification, such that a receiver configured to receive the first transport channel and not configured to receive the second transport channel may correctly receive and decode the first transport channel despite the presence of the second transport channel, the receiver comprising:
a provider for providing de-interleaver information with which first and second de-interleaver specifications may be determined; and
a de-interleaver for altering the sequence of the second interleaver units in the multiplex signal in accordance with the second de-interleaver specification, which is derived from the first convolutional interleaver specification and is inverse to the second convolutional interleaver specification, so as to acquire a de-interleaved second code word, such that the second transport channel may be correctly received and decoded.

18. The receiver as claimed in claim 17, comprising an extractor so as to extract, while using the de-interleaver information, the interleaver units of the interleaved first and/or second code word(s) from the multiplex signal.

19. The receiver as claimed in claim 17, wherein the de-interleaver is configured to additionally alter, while using the de-interleaver information, the sequence of the first interleaver units in accordance with a first de-interleaver specification, which is inverse to the first convolutional interleaver specification, so as to acquire a de-interleaved first code word.

20. The receiver as claimed in claim 17, wherein the de-interleaver operates in dependence on a transmitter-side sequence of first and second code words and in dependence on the first convolutional interleaver specification.

21. The receiver as claimed in claim 20, wherein the de-interleaver information comprises information about the transmitter-side sequence of first and/or second code words and about the first convolutional interleaver specification.

22. The receiver as claimed in claim 17, wherein the multiplex signal comprises side information which comprises the de-interleaver information.

23. The receiver as claimed in claim 17, wherein the de-interleaver information defines the first convolutional interleaver specification or a first de-interleaver specification which is inverse thereto, and wherein the provider for providing is configured to determine the second de-interleaver specification while using the first convolutional interleaver specification or the first de-interleaver specification.

24. The receiver as claimed in claim 17, comprising a working memory into which the multiplex signal may be stored, and wherein the de-interleaver comprises a memory controller configured to read out the working memory to memory addresses obtainable by the first and/or second de-interleaver specification(s), so as to acquire the de-interleaved first and/or second code word(s).

25. The receiver as claimed in claim 17, adapted to receive at least the interleaved first code word in conformity with DVB-SH (Digital Video Broadcasting-Satellite services to Handheld devices).

26. A method for joint transmission of first and second transport channels via a transmission channel, the first transport channel comprising a sequence of first interleaver units, and the second transport channel comprising a sequence of second interleaver units, each interleaver unit comprising at least one symbol, the method comprising:
   altering the sequence of the first interleaver units in accordance with a first convolutional interleaver specification, defining first transmission resources for joint transmission, so as to acquire an interleaved first transport channel comprising an altered sequence of first interleaver units;
   deriving a second convolutional interleaver specification from the first convolutional interleaver specification; and
   altering the sequence of the second interleaver units in accordance with the second convolutional interleaver specification defining second transmission resources for joint transmission, so as to acquire an interleaved second transport channel comprising an altered sequence of second interleaver units,
   wherein the second convolutional interleaver specification are derived from the first convolutional interleaver specification, so that the second transmission resources are different from the first transmission resources; and
   combining the interleaved first transport channel and the interleaved second transport channel in accordance with the first or the second convolutional interleaver specification, so as to acquire a transmission stream for the transmission channel.

27. A method of receiving a receive signal comprising first and second interleaved code words, the first interleaved code word comprising a sequence of first interleaver units interleaved in accordance with a first convolutional interleaver specification, which first interleaver units belong to a first transport channel, and the second interleaved code word comprising a sequence of second interleaver units interleaved in accordance with a second convolutional interleaver specification, which second interleaver units belong to a second transport channel, the second convolutional interleaver specification being derived from the first convolutional interleaver specification, and the interleaved first transport channel and the interleaved second transport channel being mutually interleaved, in accordance with the first or second convolutional interleaver specification, such that a receiver configured to receive the first transport channel and not configured to receive the second transport channel may correctly receive and decode the first transport channel despite the presence of the second transport channel, the method comprising:
   providing de-interleaver information with which first and second de-interleaver specifications may be determined; and
   altering the sequence of the second interleaver units in the multiplex signal in accordance with the second de-interleaver specification, which is derived from the first convolutional interleaver specification and is inverse to the second convolutional interleaver specification, so as to acquire a de-interleaved second code word, such that the second transport channel may be correctly received and decoded.

28. A non-transitory computer readable medium including a computer program comprising a program code for performing, when the computer program runs on a computer, the method for joint transmission of first and second transport channels via a transmission channel, the first transport channel comprising a sequence of first interleaver units, and the second transport channel comprising a sequence of second interleaver units, each interleaver unit comprising at least one symbol, the method comprising:
   altering the sequence of the first interleaver units in accordance with a first convolutional interleaver specification, defining first transmission resources for joint transmission, so as to acquire an interleaved first transport channel comprising an altered sequence of first interleaver units;
   deriving a second convolutional interleaver specification from the first convolutional interleaver specification; and
   altering the sequence of the second interleaver units in accordance with the second convolutional interleaver specification defining second transmission resources for joint transmission, so as to acquire an interleaved second transport channel comprising an altered sequence of second interleaver units,
   wherein the second convolutional interleaver specification are derived from the first convolutional interleaver specification, so that the second transmission resources are different from the first transmission resources; and
   combining the interleaved first transport channel and the interleaved second transport channel in accordance with the first or the second convolutional interleaver specification, so as to acquire a transmission stream for the transmission channel.

29. A non-transitory computer readable medium including a computer program comprising a program code for performing, when the computer program runs on a computer, the method of receiving a receive signal comprising first and second interleaved code words, the first interleaved code word comprising a sequence of first interleaver units interleaved in accordance with a first convolutional interleaver specification, which first interleaver units belong to a first transport channel, and the second interleaved code word comprising a sequence of second interleaver units interleaved in accordance with a second convolutional interleaver specification, which second interleaver units belong to a second transport channel, the second convolutional interleaver specification being derived from the first convolutional interleaver specification, and the interleaved first transport channel and the interleaved second transport channel being mutually interleaved, in accordance with the first or second convolutional interleaver specification, such that a receiver configured to receive the first transport channel and not configured to receive the second transport channel may correctly receive and decode the first transport channel despite the presence of the second transport channel, the method comprising:
   providing de-interleaver information with which first and second de-interleaver specifications may be determined; and
   altering the sequence of the second interleaver units in the multiplex signal in accordance with the second de-interleaver specification, which is derived from the first convolutional interleaver specification and is inverse to the second convolutional interleaver specification, so as to acquire a de-interleaved second code word, such that the second transport channel may be correctly received and decoded.

* * * * *